US012785365B2

(12) United States Patent
Ren et al.

(10) Patent No.: US 12,785,365 B2
(45) Date of Patent: Nov. 3, 2026

(54) LOW-VOLTAGE DISTRIBUTION SWITCH AND POWER SUPPLY DEVICE

(71) Applicant: BEIJING SMARTCHIP MICROELECTRONICS TECHNOLOGY COMPANY LIMITED, Beijing (CN)

(72) Inventors: Zhendong Ren, Beijing (CN); Shengming Li, Beijing (CN); Chao Huo, Beijing (CN); Ying Zhou, Beijing (CN); Yan Zhen, Beijing (CN); Hao Liu, Beijing (CN); Libin Zheng, Beijing (CN); Ganghong Zhang, Beijing (CN); Tonglei Liu, Beijing (CN); Dan Feng, Beijing (CN); Meng Li, Beijing (CN); Guorui Song, Beijing (CN)

(73) Assignee: BEIJING SMARTCHIP MICROELECTRONICS TECHNOLOGY COMPANY LIMITED, Beijing (CN)

( * ) Notice: Subject to any disclaimer, the term of this patent is extended or adjusted under 35 U.S.C. 154(b) by 195 days.

(21) Appl. No.: 18/870,445

(22) PCT Filed: Aug. 5, 2024

(86) PCT No.: PCT/CN2024/109940

§ 371 (c)(1),
(2) Date: Nov. 28, 2024

(87) PCT Pub. No.: WO2025/044697

PCT Pub. Date: Mar. 6, 2025

(65) Prior Publication Data

US 2026/0254206 A1 Aug. 27, 2026

(30) Foreign Application Priority Data

Aug. 28, 2023 (CN) ........................ 202311089681.9

(51) Int. Cl.
*H02B 1/04* (2006.01)
*G01R 15/14* (2006.01)
(Continued)

(52) U.S. Cl.
CPC ............. *H02B 1/04* (2013.01); *G01R 15/146* (2013.01); *G01R 15/18* (2013.01); *G01R 19/10* (2013.01); *G01R 22/061* (2013.01)

(58) Field of Classification Search
CPC ...... G01R 15/00; G01R 15/14; G01R 15/146; G01R 15/18; G01R 19/00; G01R 19/10;
(Continued)

(56) References Cited

U.S. PATENT DOCUMENTS 5,844,786 A * 12/1998 Yoshida ............ H02M 3/33561 363/21.01
6,624,374 B2 * 9/2003 Koyama ............. H01H 33/285 218/154
11,063,470 B2 * 7/2021 Ansett ....................... G06F 1/28

FOREIGN PATENT DOCUMENTS

CN 219142953 U 6/2023

OTHER PUBLICATIONS

Tian-Ze Wang et al., Design of Circuit Breaker Opening and Closing Coil Current Signal and Characteristic Point Acquisition System, Instrument Technique and Sensor, Oct. 2021, pp. 47-51 and 64, No. 10.

(Continued)

*Primary Examiner* — Hoai-An D. Nguyen

(57) ABSTRACT

The present disclosure relates to the field of low-voltage power distribution, and specifically discloses a low-voltage distribution switch and a power supply device, wherein the power distribution switch includes a switch module, a plurality of current detection modules and a metering module. A plurality of input ends of the switch module are adapted
(Continued)

to be correspondingly connected to the multi-phase power supply line. The input ends of the plurality of current detection modules are correspondingly connected to the plurality of output ends of the switch module. The output ends of the plurality of current detection modules are adapted to be correspondingly connected to the multi-phase power supply line. Each of the current detection modules includes a plurality of current branches and a current detection unit. The distribution switch can improve the linearity and accuracy of the power metering function.

33 Claims, 7 Drawing Sheets

(51) Int. Cl.
*G01R 15/18* (2006.01)
*G01R 19/10* (2006.01)
*G01R 22/06* (2006.01)

(58) Field of Classification Search
CPC ...... G01R 22/00; G01R 22/06; G01R 22/061; H02B 1/00; H02B 1/015; H02B 1/04
USPC ............................................... 324/76.11, 107
See application file for complete search history.

(56) References Cited

OTHER PUBLICATIONS

Yuan Jiang et al., Synchronous Control System for Synthetic Test of Circuit Breaker, High Voltage Apparatus, Aug. 16, 2015, pp. 152-157, vol. 51, No. 8.
Zhiying Chen et al., Design of Online Coil Current Monitoring System for High Voltage Circuit Breaker, Journal of Xiamen University of Technology, Oct. 2016, pp. 6-12, vol. 24, No. 5.
Jianying Zhong et al., High-voltage circuit breaker on-line monitoring system based on opening and closing coil current signal, Modern Electronics Technique, Nov. 15, 2016, pp. 133-137, vol. 39, No. 22.
He-Ying Bian et al., Design of online monitoring system for breaker status based on closing coils signal, Modern Electronics Technique, Feb. 1, 2014, pp. 100-104, vol. 37, No. 3.
Yongquan Bao et al., Design of Intelligent Low Voltage DC Circuit Breaker, Mar. 2021, pp. 7-9, vol. 41, No. 3.

* cited by examiner

LOW-VOLTAGE DISTRIBUTION SWITCH AND POWER SUPPLY DEVICE

TECHNICAL FIELD

The present disclosure relates to the field of low-voltage power distribution, and in particularly, to a low-voltage distribution switch and a power supply device.

BACKGROUND

In the traditional field of low-voltage power distribution, the low-voltage distribution switch is mainly used for switching and connecting power supply lines and providing power supply protection for circuits. With the large-scale application of new energy, the power distribution switch is also used for merging new energy power grid into the main power supply grid and detecting the quality of new energy and other functions. In order to meet the needs of the new situation, the National Energy Administration formulated the relevant standards for distribution switches, and made detailed provisions on application scenarios and performance indicators. The power metering of distribution switches is an important function, that may be used for power charging, line loss analysis and fault analysis. At present, the design scheme of the low-voltage distribution switch in the related art is as follows. With three current transformers and three voltage transformers, one SAR (Successive Approximation Register) type Analog-to-Digital Converter (ADC) is used to connect 6 analog signals, and connect 3 current signals and 3 voltage signals respectively. The six signals are time-share sampled by the one ADC. Then, the micro-controller is used to perform real-time analysis of the sampled values and analysis of over-voltage and over-current protection, so as to realize the corresponding functions of power supply protection and electric quantity analysis.

The disadvantage of the above-mentioned related art is that since the current in the low-voltage distribution transformer has a large variation range, and the variation range can reach 1 ampere to 400 amperes, the low-voltage distribution switch is easy to generate transformer magnetic saturation, and thus the current measurement is inaccurate, so that the power metering linearity of the low-voltage distribution switch is low. For example, the power metering linearity of the low-voltage distribution switch cannot achieve a level of 0.2 S.

SUMMARY

The present disclosure is directed to solve at least one of the technical problems in the related art to some extent. To this end, a first object of the present disclosure is to provide a low-voltage distribution switch, where a plurality of current detection modules and metering modules are provided, and each current detection module includes a plurality of current detection units and a plurality of current branches connected in parallel. When the low-voltage distribution switch is in normal operation, the plurality of current branches can achieve a shunting effect so as to reduce the current value passing in each current branch, so that the accuracy and linearity of current detection signals of the plurality of branches obtained by the current detection units can be improved, and thus the linearity and accuracy of the electric energy metering function can be improved.

A second object of the present disclosure is to propose a power supply device.

To achieve the above object, according to a first aspect of the present disclosure, a low-voltage distribution switch is provided, including: a switch module, wherein a plurality of input ends of the switch module serve as voltage inlet wire ends of the low-voltage distribution switch and are configured to correspondingly connect to a multi-phase power supply line; the switch module is configured to connect or disconnect the multi-phase power supply line; a plurality of current detection modules, wherein input ends of the plurality of current detection modules are correspondingly connected to a plurality of output ends of the switch module; output ends of the plurality of current detection modules serve as voltage outlet wire ends of the low-voltage distribution switch and are configured to correspondingly connected to the multi-phase power supply line; each of the current detection modules includes a plurality of current branches and a current detection unit, wherein the plurality of current branches are connected in parallel between the input end and the output end of the corresponding current detection module; the current detection unit is configured to detect the current of each current branch to obtain a plurality of branch current detection signals, and obtain a current detection signal of a corresponding phase power supply line on the basis of a plurality of branch current detection signals; a voltage detection module, wherein a plurality of input ends of the voltage detection module are connected to a plurality of output ends of the switch module and a neutral line inlet end of the low-voltage distribution switch; the neutral line inlet end is configured to connect to a neutral line of the power supply line; the voltage detection module is configured to detect a voltage of each phase power supply line of a multi-phase power supply line to obtain a plurality of voltage detection signals; a metering module, wherein the metering module is respectively connected to the voltage detection module and a plurality of the current detection units; the metering module is configured to sample the plurality of voltage detection signals and the plurality of current detection signals, obtain a plurality of first voltages according to the plurality of voltage detection signals, calculate a plurality of first currents according to the plurality of the current detection signals, and determine first electric energy metering data of the multi-phase power supply line based on the plurality of first voltages and the plurality of first currents.

According to the low-voltage distribution switch of the embodiment of the present disclosure, a plurality of current detection modules and metering modules are provided, and each current detection module includes a plurality of current detection units and a plurality of current branches connected in parallel. When the low-voltage distribution switch is in normal operation, the plurality of current branches can achieve a shunting effect so as to reduce the current value passing in each current branch, so that the accuracy and linearity of current detection signals of the plurality of branches obtained by the current detection units can be improved, and thus the linearity and accuracy of the electric energy metering function can be improved.

According to an embodiment of the present disclosure, the current detection unit includes: a plurality of current transformers, wherein input ends of the plurality of current transformers are correspondingly coupled and connected to the plurality of current branches; each of the current transformers is configured to detect the current of a corresponding current branch to obtain the branch current detection signal; and an adder module, wherein an input end of the adder module is connected to output ends of the plurality of current transformers; an output end of the adder module is connected to the metering module; and the adder module is configured to sum up the plurality of branch current detection signals to obtain a current detection signal of a corresponding phase power supply line.

According to an embodiment of the present disclosure, the adder module includes: a plurality of signal buffers, wherein input ends of the plurality of signal buffers are correspondingly connected to output ends of the plurality of current transformers; each of the signal buffers is configured to buffer a corresponding branch current detection signal; and an adder, wherein a plurality of input ends of the adder are correspondingly connected to output ends of the plurality of signal buffers; an output end of the adder is connected to the metering module; and the adder is configured to sum up the buffered plurality of branch current detection signals to obtain a current detection signal of a corresponding phase power supply line.

According to an embodiment of the present disclosure, the signal buffer includes: a first resistor, wherein one end of the first resistor is connected to a first output end of a corresponding current transformer; a second resistor, wherein one end of the second resistor is connected to a second output end of the corresponding current transformer; a first operational amplifier, wherein a first input end of the first operational amplifier is connected to the other end of the first resistor; a second input end of the first operational amplifier is connected to the other end of the second resistor; an output end of the first operational amplifier is connected to a corresponding input end of the adder; a third resistor connected in series between the second input end of the first operational amplifier and ground; and a fourth resistor connected in series between the first input end and the output end of the first operational amplifier.

According to an embodiment of the present disclosure, the first resistor, the second resistor, the third resistor and the fourth resistor have a same resistance value.

According to an embodiment of the present disclosure, the adder includes: a plurality of fifth resistors, wherein one end of the plurality of fifth resistors is correspondingly connected to the output ends of the plurality of signal buffers; a second operational amplifier, wherein a first input end of the second operational amplifier is connected to the other ends of the plurality of fifth resistors; a second input end of the second operational amplifier is grounded; an output end of the second operational amplifier is connected to the metering module; and a sixth resistor, wherein the sixth resistor is connected in series between the first input end and the output end of the second operational amplifier.

According to an embodiment of the present disclosure, the fifth resistance and the sixth resistance have a same resistance value.

According to an embodiment of the present disclosure, the current detection module further includes: a shunt, wherein an input end of the shunt serves as an input end of the current detection module; and a current combiner, wherein a plurality of input ends of the current combiner are correspondingly connected to a plurality of output ends of the shunt via a plurality of voltage connection lines; and an output end of the current combiner serves as an output end of the current detection module; wherein the plurality of current branches are formed by the shunt, the current combiner and the plurality of voltage connection lines, and are connected in parallel between the input end and the output end of the corresponding current detection module.

According to an embodiment of the present disclosure, the shunt includes a first conductive member, a voltage inlet wire and a plurality of first voltage branch lines, wherein one end of the voltage inlet wire serves as an input end of the shunt, and the other end of the voltage inlet wire is connected to an input end of the first conductive member; one ends of the plurality of first voltage branch lines are connected to a plurality of output ends of the first conductive member, and the other ends of the plurality of first voltage branch lines serves as a plurality of output ends of the shunt, wherein the plurality of output ends of the first conductive member are located on the same side of the first conductive member, and the plurality of output ends of the first conductive member and the input ends of the first conductive member are located on different sides of the first conductive member.

According to an embodiment of the present disclosure, the current combiner includes a second conductive member, a plurality of second voltage branch lines and a voltage outlet wire, wherein one ends of the plurality of second voltage branch lines serve as a plurality of input ends of the current combiner, the other ends of the plurality of second voltage branch lines are connected to the plurality of input ends of the second conductive member; one end of the voltage outlet wire is connected to an output end of the second conductive member, and the other end of the voltage outlet wire serves as an output end of the current combiner, wherein the plurality of input ends of the second conductive member are located on a same side of the second conductive member; and the plurality of input ends of the second conductive member and the output end of the second conductive member are located on different sides of the second conductive member.

According to an embodiment of the present disclosure, the plurality of current transformers are divided into at least one transformer group, wherein the transformer group includes two current transformers symmetrically arranged on both sides of the support plate and having opposite winding directions; and two adjacent current transformers located on a same side of the support plate have opposite winding directions.

According to an embodiment of the present disclosure, the low-voltage distribution switch further includes an ADC sampling module, wherein the ADC sampling module is connected to a plurality of current detection units; and the ADC sampling module is configured to sample a plurality of current detection signals to obtain a plurality of current sampling signals for performing power supply protection based on the plurality of current sampling signals.

According to an embodiment of the present disclosure, the ADC sampling module is further connected to the voltage detection module; and the ADC sampling module is further configured to sample a plurality of the voltage detection signals to obtain a plurality of voltage sampling signals so as to perform power supply protection based on the plurality of current sampling signals and the plurality of voltage sampling signals.

According to an embodiment of the present disclosure, the low-voltage distribution switch further includes a main control module connected to the metering module and the ADC sampling module, wherein the main control module is configured to acquire the first electric energy metering data from the metering module when the metering module has not failed, acquire the plurality of current sampling signals and the plurality of voltage sampling signals from the ADC sampling module when the metering module fails, and determine the first electrical energy metering data based on the plurality of current sampling signals and the plurality of voltage sampling signals; the main control module is also configured to acquire the plurality of current sampling signals and the plurality of voltage sampling signals from the ADC sampling module when the ADC sampling module has not failed, so as to perform power supply protection based on the plurality of current sampling signals and the plurality of voltage sampling signals; when the ADC sampling module fails, acquire the plurality of first currents and the plurality of first voltages from the metering module so as to perform power supply protection based on the plurality of first currents and the plurality of first voltages.

According to an embodiment of the present disclosure, the main control module is configured to determine that the metering module fails when the direct current component of the first voltage is greater than a preset direct current component, and determine that the ADC sampling module fails when the DC component of the second voltage is greater than the preset DC component.

According to an embodiment of the present disclosure, the main control module is configured to calculate a plurality of second voltages according to the plurality of voltage sampling signals, acquire a voltage difference value between each of the first voltages and the corresponding second voltage to obtain a plurality of voltage difference values, and determine whether the metering module and the ADC sampling module fail based on the plurality of first voltages and the plurality of second voltages when any voltage difference value in the plurality of voltage difference values is greater than or equal to a first preset voltage difference value threshold.

According to an embodiment of the present disclosure, the main control module is configured to determine whether the metering module and the ADC sampling module fail based on at least one of a DC component, a magnitude, a waveform distortion, a power, a power factor, a frequency, and a phase sequence corresponding to the plurality of first voltages and the plurality of second voltages.

According to an embodiment of the present disclosure, the main control module is configured to determine that the metering module fails when the direct current component of the first voltage is greater than a preset direct current component, and determine that the ADC sampling module fails when the DC component of the second voltage is greater than the preset DC component.

According to an embodiment of the present disclosure, the main control module is configured to determine that the metering module fails when the amplitude of the first voltage is not within a preset amplitude range, and determine that the ADC sampling module fails when the amplitude of the second voltage is not within the preset amplitude range.

According to an embodiment of the present disclosure, the main control module is configured to determine that the metering module fails when the waveform distortion of the first voltage is greater than a first preset distortion, or the waveform distortion of the first voltage is greater than the waveform distortion of the second voltage, and a difference between the waveform distortion of the first voltage and the waveform distortion of the second voltage is greater than a second preset distortion; determine that the ADC sampling module fails when the waveform distortion of the second voltage is greater than the first preset distortion, or the waveform distortion of the second voltage is greater than the waveform distortion of the first voltage, and the difference value between the waveform distortion of the second voltage and the waveform distortion of the first voltage is greater than the second preset distortion.

According to an embodiment of the present disclosure, the main control module is configured to determine that the metering module fails when the first power corresponding to the first voltage is negative, and determine that the ADC sampling module fails when the second power corresponding to the second voltage is negative.

According to an embodiment of the present disclosure, the main control module is configured to determine that the metering module fails when a first power factor corresponding to the first voltage is less than a preset power factor, and determine that the ADC sampling module fails when a second power factor corresponding to the second voltage is less than the preset power factor.

According to an embodiment of the present disclosure, the main control module is configured to determine that the ADC sampling module fails when a frequency difference value between the frequency of the first voltage and a preset frequency is less than a frequency difference value between the frequency of the second voltage and the preset frequency, and a frequency difference between the frequency of the second voltage and the frequency of the first voltage is greater than a preset frequency difference; determine that the metering module fails when the frequency difference value between the frequency of the second voltage and the preset frequency is less than the frequency difference value between the frequency of the first voltage and the preset frequency, and the frequency difference value between the frequency of the first voltage and the frequency of the second voltage is greater than the preset frequency difference.

According to an embodiment of the present disclosure, the main control module is configured to determine that the metering module fails when the phase sequence of the plurality of first voltages are different from a preset phase sequence; and determine that the ADC sampling module fails when the phase sequence of the plurality of second voltages are different from the preset phase sequence.

According to an embodiment of the present disclosure, a first frequency at which the main control module acquires the plurality of first currents and the plurality of first voltages from the metering module is less than a second frequency at which the plurality of current sampling signals and the plurality of voltage sampling signals are acquired from the ADC sampling module, wherein the main control module is further configured to perform power supply protection based on the plurality of first currents, the plurality of first voltages and the first frequency when the ADC sampling module fails.

According to an embodiment of the present disclosure, the main control module is further configured to modify the plurality of first voltages and the plurality of first currents based on a ratio of the second voltage to the first voltage when each of the plurality of voltage difference values is less than the first preset voltage difference value threshold and greater than a second preset voltage difference value threshold, wherein the second preset voltage difference value threshold is less than the first preset voltage difference value threshold.

According to an embodiment of the present disclosure, the main control module is further configured to analyze the first electrical energy metering data to obtain second electrical energy metering data.

According to an embodiment of the present disclosure, the low-voltage distribution switch further includes:

- a protection control module, wherein the protection control module is connected to the switch module for controlling the switch module; wherein the main control module is further connected to the protection control module; the main control module is further configured to generate a protection signal and send same to the protection control module according to the plurality of current sampling signals and the plurality of voltage sampling signals, or according to the plurality of first currents and the plurality of first voltages, so that the protection control module controls the switch module for disconnection to provide power supply protection based on the protection signal.

According to an embodiment of the present disclosure, the low-voltage distribution switch further includes a state acquisition module, wherein the state acquisition module is connected to the switch module and the main control module; and the state acquisition module is configured to acquire a switch state and/or a power supply protection mode of the switch module and send same to the main control module.

According to an embodiment of the present disclosure, the low-voltage distribution switch further includes a proxy module and an isolation module, wherein the proxy module is connected to the metering module, the ADC sampling module, the protection control module, the state acquisition module and the isolation module; the isolation module is connected to the main control module, wherein the proxy module is configured to acquire the first electric energy metering data, the plurality of first voltages, the plurality of first currents, the plurality of voltage sampling signals, the plurality of current sampling signals and the switch state and/or the power supply protection mode, send same to the main control module via the isolation module, and receive the protection signal by the isolation module and send same to the protection control module.

According to an embodiment of the present disclosure, the proxy module sends data of the metering module with a lower priority than that of data of the ADC sampling module and with a higher priority than that of data of the state acquisition module.

According to an embodiment of the present disclosure, the low-voltage distribution switch further includes a first power supply module and a second power supply module, wherein an input end of the first power supply module is connected to the plurality of input ends of the switch module; an output end of the first power supply module is connected to an input end of the second power supply module; and an output end of the second power supply module is connected to the isolation module, wherein the first power supply module is configured to convert a first power supply voltage provided by the multi-phase power supply line into a second power supply voltage; the second power supply module is configured to convert the second power supply voltage into a third power supply voltage and provide same to the isolation module; and the proxy module and the main control module are powered by the isolation module.

In order to achieve the above according to a second aspect of the present disclosure, a power supply device is provided, including the aforementioned low-voltage distribution switch.

According to the power supply device of the embodiment of the present disclosure, it is possible to achieve a power metering function with high linearity and accuracy by the aforementioned low-voltage distribution switch, thereby realizing optimization of the power supply device.

Additional aspects and advantages of the present disclosure will be set forth in part in the description which follows and, in part, will be obvious from the description, or may be learned by practice of the present disclosure.

DETAILED DESCRIPTION

Figure 1:
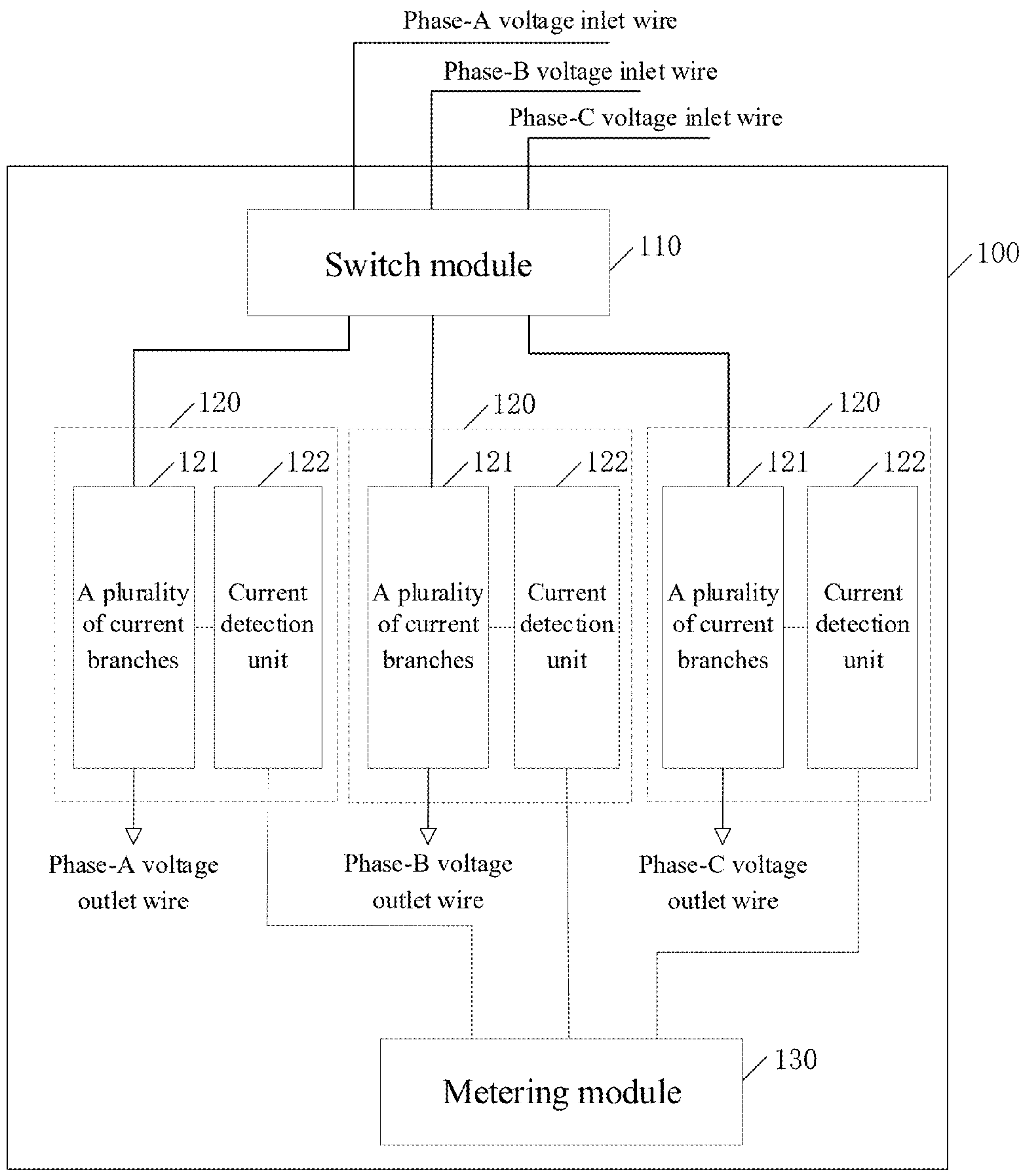
FIG. 1 is a schematic structural diagram of a low-voltage distribution switch according to an embodiment of the present disclosure.

Reference will now be made in detail to the embodiments of the present disclosure, examples of which are illustrated in the accompanying drawings, wherein like reference numerals refer to the same or similar elements throughout the several views, and or refer to having the same or similar elements throughout the several views. The embodiments described below with reference to the figures are exemplary and are intended to be illustrative of the present disclosure and are not to be construed as limiting the present disclosure.

Hereinafter, a low-voltage distribution switch and a power supply device according to an embodiment of the present disclosure will be described with reference to the accompanying drawings.

FIG. 1 is a schematic structural view of a low-voltage distribution switch according to an embodiment of the present disclosure. As shown with reference to FIG. 1, the low-voltage distribution switch 100 includes a switch module 110, a plurality of current detection modules 120 and a metering module 130.

Herein, a plurality of input ends of the switch module 110 serve as voltage inlet wire ends of the low-voltage distribution switch 100 and are adapted to be correspondingly connected to a multi-phase power supply line. The switch module 110 is configured for connecting or disconnecting the multi-phase power supply line. Input ends of the plurality of current detection modules 120 are correspondingly connected to a plurality of output ends of the switch module 110. The output ends of the plurality of current detection modules 120 serve as voltage outlet wire ends of the low-voltage distribution switch 100 and are adapted to be correspondingly connected to the multi-phase power supply line. Each of the current detection modules 120 includes a plurality of current branches 121 and a current detection unit 122. The plurality of current branches 121 are connected in parallel between the input end and the output end of the corresponding current detection module 120. The current detection unit 122 is configured for detecting the current of each current branch 121 to obtain a plurality of branch current detection signals, and obtaining a current detection signal of a corresponding phase power supply line on the basis of a plurality of branch current detection signals. The metering module 130 is connected to the plurality of current detection units 122, and the metering module 130 is configured for sampling the plurality of current detection signals, calculating a plurality of first currents according to the plurality of current detection signals, and determining first electric energy metering data of the multi-phase power supply line based on the plurality of first currents.

Specifically, the multi-phase power supply line in the embodiment of the present disclosure may include various multi-phase power supply lines. The low-voltage distribution switch 100 in the embodiment of the present disclosure is described below by taking the multi-phase power supply line as a three-phase power supply line as an example. Currently, the three-phase power supply line in China is a three-phase four-wire system. As shown in FIG. 1, the multi-phase power supply line includes an ABC three-phase voltage inlet wire and a voltage neutral line (not shown). At this time, the low-voltage distribution switch 100 includes three current detection modules 120, and the ABC three-phase voltage inlet wires are respectively connected to a plurality of input ends of the switch module 110. The multi-phase power supply line also includes an ABC three-phase voltage outlet, and the ABC three-phase voltage outlet is respectively connected to an output end of a corresponding current detection module 120. The low-voltage distribution switch 100 can control a multi-phase power supply line to be turned on or off via a switch module 110. With reference to FIG. 1, when the switch module 110 is turned on, the ABC three-phase inlet wire of the multi-phase power supply line can be connected to a corresponding three-phase outlet wire via the switch module 110 and the corresponding current detection module 120, so that the low-voltage distribution switch 100 achieves the functions of switching and connecting power supply lines.

Meanwhile, with continuing reference to FIG. 1, each current detection module 120 includes a plurality of current branches and a current detection unit 122. It can be seen from the current characteristic that when the switch module 110 is conductive, the sum of the currents on the plurality of current branches 121 in each current detection module 120 is equal to the current on the phase power supply line. Therefore, when the current detection unit 122 detects the currents of the plurality of current branches 121 in a certain current detection module 120 to obtain a plurality of branch current detection signals, the current detection unit 122 can obtain the current detection signal of the corresponding phase power supply line by adding the plurality of branch current detection signals. The metering module 130 may then sample the three current detection signals, determine a first current for a corresponding phase supply line based on the plurality of current detection signals, and determine first ionization energy metering data for the multi-phase supply line at that time based on the three first currents. Thus, the electric energy metering function of the low-voltage distribution switch 100 is realized.

In addition, in the related art, a current transformer is usually used to measure the current of each phase power supply line. However, because the fluctuation on the current of each phase power supply line is too large, when the current is too large, the magnetic core of the transformer is likely to be saturated, so that the secondary signal is distorted, thus reducing the accuracy of measurement data. However, overcoming the core saturation problem results in poor linearity of the supply line when the current is low. Therefore, the current transformer in the related art cannot achieve the accuracy and linearity required by Class 0.2 S, where 0.2 represents that the maximum specific difference of the current transformer is less than 0.2% and the angular difference is less than 10° at 50 Hz and rated current. S represents a special current transformer and requires high enough accuracy in the 1%-120% load range. However, in the embodiment of the present disclosure, by providing a plurality of current branches 121 in each current detection module 120, the current value passing in each current branch 121 is reduced by shunting, and the current fluctuation in each current branch 121 is also low, which is equivalent to extending the measurement range of the current value. Therefore, the current detection unit 122 of the embodiment of the present disclosure does not suffer from excessive current fluctuation when detecting the current in the current branch 121, so that the detected branch current detection signal is more advantageous in terms of accuracy and linearity. Therefore, the first electric energy metering data determined by the metering unit 130 of the embodiment of the present disclosure also has higher accuracy and linearity.

In the above-mentioned embodiments, a plurality of current detection modules and the metering module are provided, and each current detection module includes a plurality of current detection units and a plurality of current branches connected in parallel. Each current detection unit is connected in parallel to a corresponding current branch. When the low-voltage distribution switch is conductive, the current detection units can detect the current of each current branch to obtain a plurality of branch current detection signals, and obtain a current detection signal of a corresponding phase power supply line based on the plurality of branch current detection signals. Then, the metering module can sample the plurality of current detection signals, and calculate and obtain a plurality of first currents and first electric energy metering data to realize the electric energy metering function. Meanwhile, a plurality of current branches can achieve the effect of shunting, so as to reduce the current value passing through each current branch, thereby improving the accuracy and linearity of multiple branch current detection signals obtained by the current detection unit, and further improving the linearity and accuracy of the electric energy metering function.

Alternatively, when the multi-phase power supply line is a three-phase four-wire power supply line, the metering module 130 can be realized by using chips such as ATT7022 or RN8302, and the inputs of these metering chips have three voltage signals and four current signals, which are mainly used for measuring data such as voltage effective value, current effective value, power and electric energy of the low-voltage line. Therefore, the electric energy metering function of the low-voltage distribution switch in the above-mentioned embodiment of the present disclosure can be realized.

Figure 2:
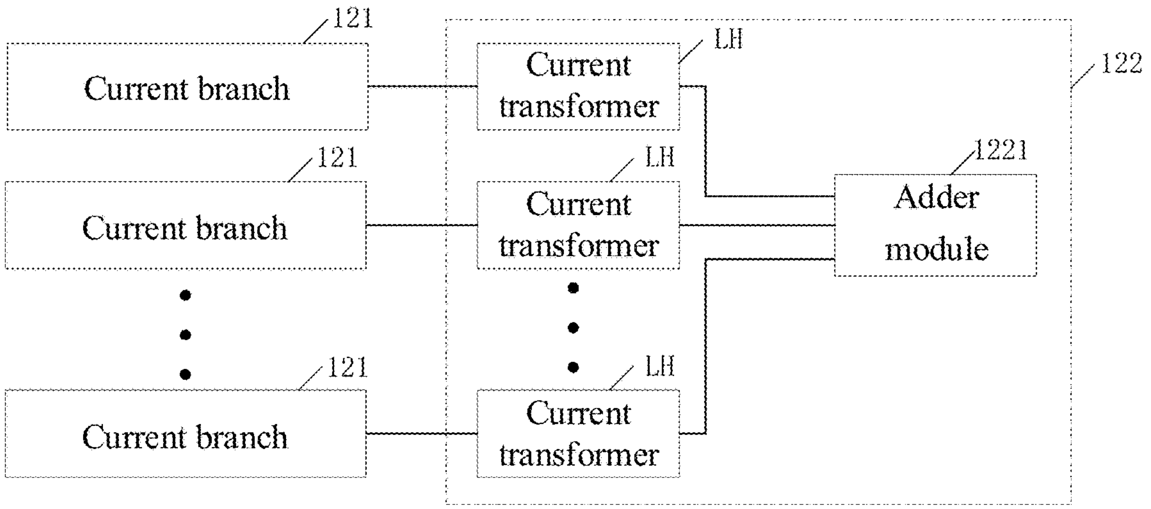
FIG. 2 is a schematic structural diagram of a current detection unit according to an embodiment of the present disclosure.

In some embodiments, as shown with reference to FIG. 2, the current detection unit 122 includes a plurality of current transformers LH and an adder module 1221, wherein input ends of the plurality of current transformers LH are correspondingly coupled and connected to the plurality of current branches 121. Each current transformer LH is configured for detecting the current of the corresponding current branch 121 to obtain a branch current detection signal. An input end of the adder module 1221 is connected to an output end of a plurality of current transformers LH. An output end of the adder module 1221 is connected to the metering module 130. The adder module 1221 is configured for summing a plurality of branch current detection signals to obtain a current detection signal of a corresponding phase power supply line.

Specifically, it can be seen from the above that in each current detection module 120, the sum of the currents in the plurality of current branches 121 is equal to the current of the power supply line of the corresponding phase of the current detection unit 122; therefore, a plurality of current transformers LH and an adder module 1221 can be provided in the current detection unit 122, wherein each current transformer LH is correspondingly coupled and connected to the plurality of current branches 121, as shown in FIG. 2, so as to detect the current of the corresponding current branch 121 and output same to the adder module 1221. Thus, the adder module 1221 obtains a plurality of branch current detection signals, and then the adder module 1221 sums the plurality of branch current detection signals to obtain a current detection signal of a corresponding phase power supply line. Thus, the current detection unit realizes the function of detecting and obtaining a plurality of branch current detection signals, and thereby obtaining a current detection signal of the corresponding phase power supply line.

Figure 3:
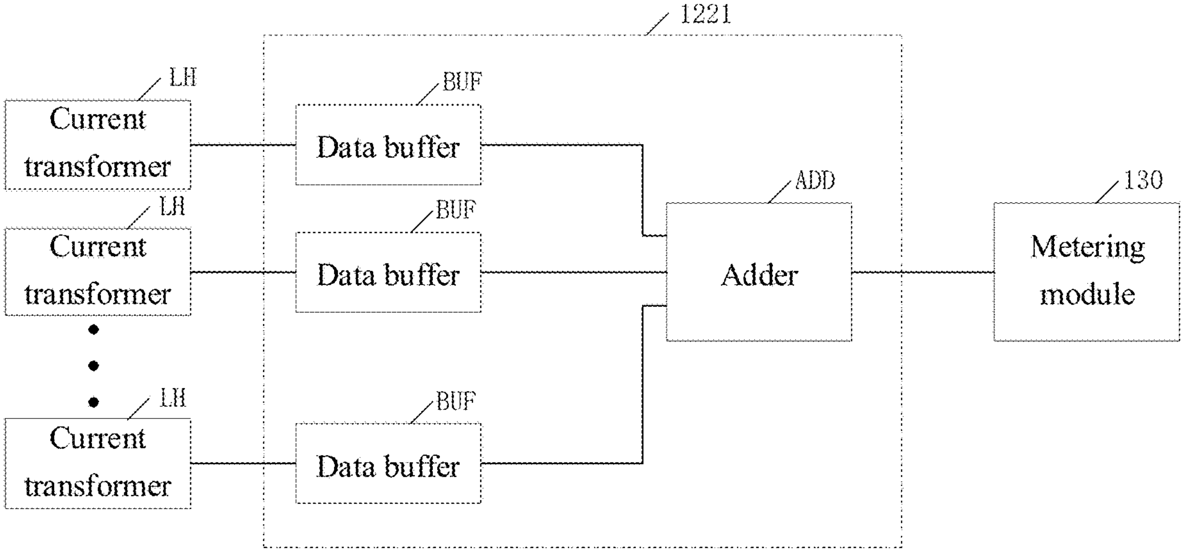
FIG. 3 is a schematic diagram of an adder module according to an embodiment of the present disclosure.

In some embodiments, with reference to FIG. 3, the adder module 1221 includes a plurality of signal buffers BUF and an adder ADD, wherein input ends of the plurality of signal buffers BUF are correspondingly connected to output ends of the plurality of current transformers LH, and each signal buffer BUF is configured for buffering a corresponding branch current detection signal. A plurality of input ends of the adder ADD are correspondingly connected to output ends of a plurality of signal buffers BUF. An output end of the adder ADD is connected to the metering module 130. The adder ADD is configured for summing the buffered plurality of branch current detection signals to obtain current detection signals of the corresponding phase power supply line.

Specifically, with reference to FIG. 3, a plurality of signal buffers BUF are disposed between a corresponding current transformer LH and an input end of an adder ADD, and the signal buffers BUF can buffer a branch current detection signal output by the corresponding current transformer LH and then input same into the adder ADD, so that the adder ADD can obtain the plurality of branch current detection signals. The adder ADD is mainly configured for summing the buffered multiple branch current detection signals to obtain a current detection signal of a corresponding phase power supply line, so as to realize the corresponding function of the adder module 1221. Meanwhile, the signal buffer BUF can suppress the common-mode signal on the secondary output conductive harness of the current transformer LH, so it can improve the common-mode rejection ratio and further reduce the distortion of the branch current detection signal during transmission. The signal buffer BUF also has the function of signal isolation, and can prevent the current at the adder ADD terminal from affecting the normal operation of the current transformer LH, so that the accuracy of the finally determined current detection signal can be improved.

Figure 4:
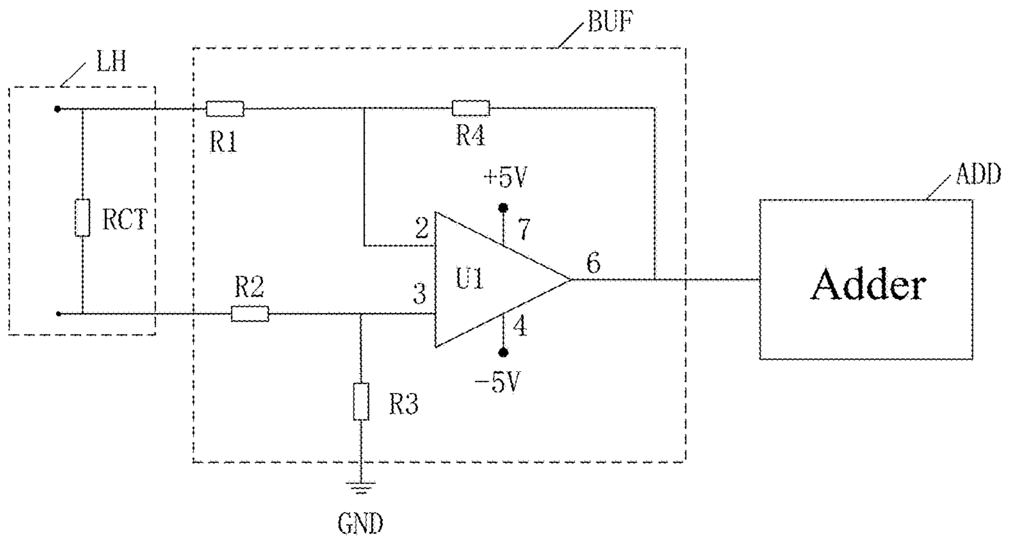
FIG. 4 is a circuit diagram of a data buffer according to an embodiment of the present disclosure.

Further, with reference to FIG. 4, the signal buffer BUF includes a first resistor R1, a second resistor R2, a first operational amplifier U1, a third resistor R3, and a fourth resistor R4. Here, one end of the first resistor R1 is connected to a first output end of a corresponding current transformer LH. One end of the second resistor R2 is connected to a second output end of the corresponding current transformer LH. A first input end of the first operational amplifier U1 is connected to the other end of the first resistor R1. A second input end of the first operational amplifier U1 is connected to the other end of the second resistor R2. An output end of the first operational amplifier U1 is connected to a corresponding input end of the adder ADD. The third resistor R3 is connected in series between a second input end of the first operational amplifier U1 and ground. The fourth resistor R4 is connected in series between the first input and the output of the first operational amplifier U1.

Further, the first resistor R1, the second resistor R2, the third resistor R3 and the fourth resistor R4 have the same resistance value.

Specifically, the current transformer LH mainly measures a current on a corresponding current branch according to an electromagnetic induction principle, and two output ends of a secondary winding of the current transformer are a first output end and a second output end of the current transformer LH. As shown in FIG. 4, the first output end and the second output end of the current transformer LH are respectively connected to one ends of the first resistor R1 and the second resistor R2 so as to input a detected branch current detection signal to a signal buffer BUF. At this moment, the current transformer LH can be equivalent to a load resistor RCT. The first to fourth resistors (R1-R4) and the first operational amplifier U1 in the signal buffer BUF constitute a differential amplification circuit, and can perform differential amplification on the branch current detection signal input by the current transformer LH. The amplification factor depends on the resistance values of the first resistor R1 to the fourth resistor R4. Meanwhile, since the signal buffer in the embodiment of the present disclosure does not need to realize a signal amplification function, the resistance values of the first to fourth resistors can be made the same. At this time, the amplification factor of the signal buffer BUF is 1, so as to realize the effect of improving the common mode rejection ratio of the signal buffer and realizing circuit isolation.

As a specific example, the OP1177 chip can be used as the first operational amplification U1, and the resistance value from the first resistor to the fourth resistor can be selected as 100 KΩ. In this case, the signal buffer BUF also has the function of improving the input impedance of the adder module 1221.

In some embodiments, illustrated with reference to FIG. 5, the adder ADD includes a plurality of fifth resistors R5, wherein one ends of the plurality of fifth resistors R5 are correspondingly connected to the output ends of the plurality of signal buffers BUF; a second operational amplifier U2, wherein a first input end of the second operational amplifier U2 is connected to the other ends of the plurality of fifth resistors R5; a second input end of the second operational amplifier U2 is grounded to the GND; an output end of the second operational amplifier U2 is connected to the metering module 130; and a sixth resistor R6, wherein the sixth resistor R6 is connected in series between the first input terminal and the output terminal of the second operational amplifier U2.

Further, the fifth resistor R5 and the sixth resistor R6 have the same resistance value.

Figure 5:
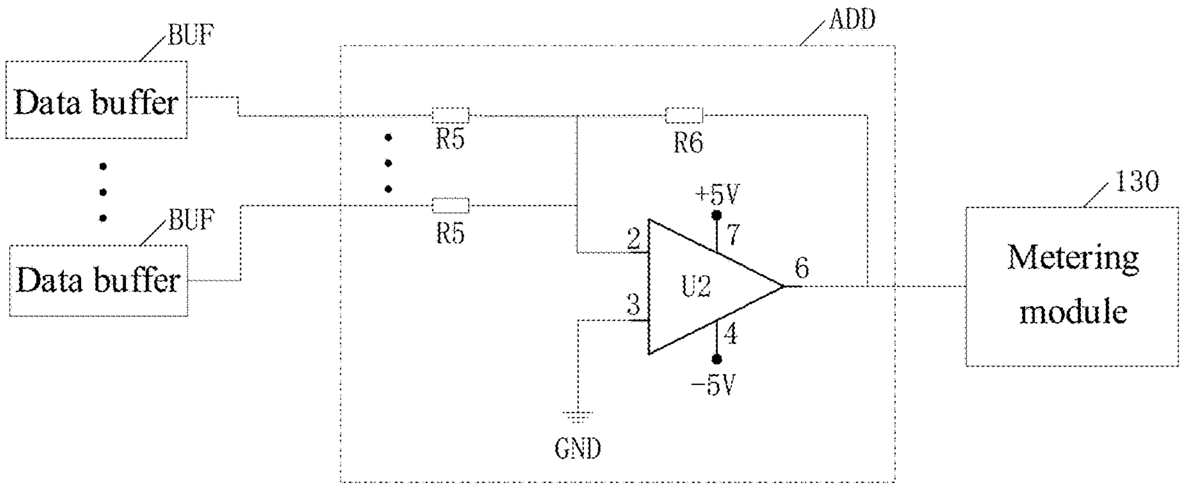
FIG. 5 is a circuit diagram of an adder in according to an embodiment of the present disclosure.

Specifically, with reference to FIG. 5, a second operational amplifier U2, a fifth resistor R5 and a sixth resistor R6 constitute a closed-loop amplification circuit. Since the output ends of a plurality of signal buffers BUF are connected in parallel to a first input end of the second operational amplifier U2 via a plurality of fifth resistors R5, the second operational amplifier U2 can achieve the functions of adding and amplifying a plurality of branch current detection signals, and the amplification factor is determined by the resistance values of the sixth resistor R6 and the fifth resistor R5. Thus, the resistance values of the fifth resistor and the sixth resistor can be made to be the same. For example, the resistance values of the fifth resistor and the sixth resistor can be made to be 1 kΩ. In this case, the amplification factor of the closed loop amplification circuit is 1, and the adder ADD can achieve the function of adding a plurality of branch current detection signals to obtain a current detection signal of a corresponding phase power supply line. Meanwhile, the second operational amplifier U2 in the adder ADD also has the function of improving the output driving capability, and the specific principle is not expanded here.

Alternatively, the second operational amplifier U2 may be an OP1177 chip, which has the advantages of low noise, high precision and low power consumption, thereby enabling the optimization of the adder ADD.

Figure 6:
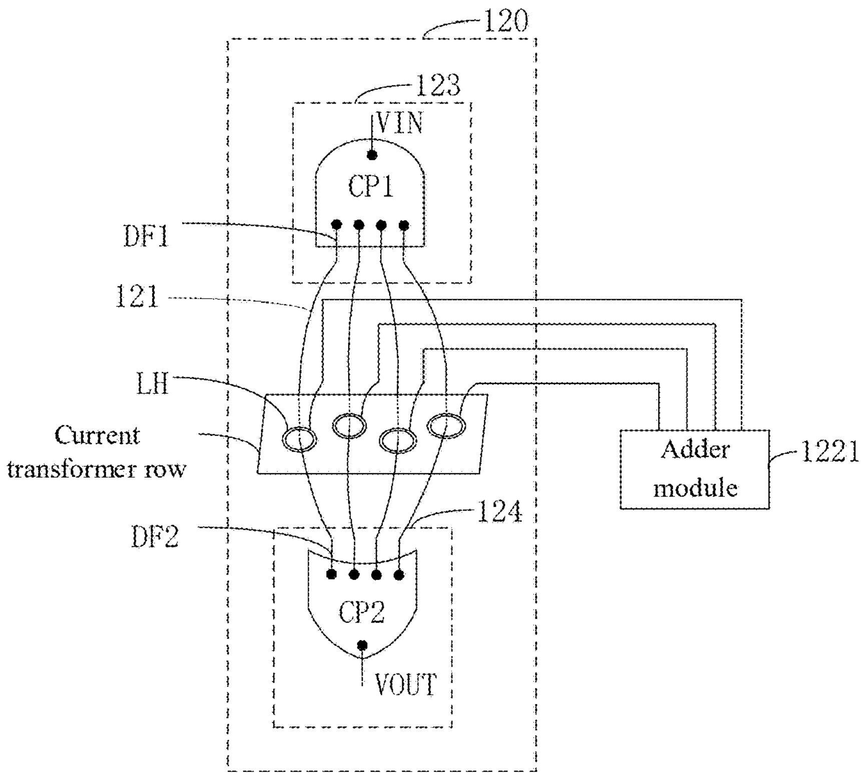
FIG. 6 is a schematic structural diagram of a shunt according to an embodiment of the present disclosure.

In some embodiments, as shown with reference to FIG. 6, the current detection module 120 further includes a shunt 123 and a current combiner 124, wherein an input end of the shunt 123 serves as an input end of the current detection module 120. A plurality of input ends of the current combiner 124 are correspondingly connected to a plurality of output ends of the shunt 123 via a plurality of voltage connection lines, and an output end of the current combiner 124 serves as an output end of the current detection module 120, wherein a plurality of current branches 121 are formed by the shunt 123, the current combiner 124 and a plurality of voltage connection lines, and are connected in parallel between the input end and the output end of the corresponding current detection module 120.

Furthermore, the shunt 123 includes a first conductive member CP1, a voltage inlet wire VIN and a plurality of first voltage branch lines DF1. Herein, one end of the voltage inlet wire VIN serves as an input end of the shunt 123, and the other end of the voltage inlet wire VIN is connected to the input end of the first conductive member CP1. One end of the plurality of first voltage branch lines DF1 is connected to a plurality of output ends of the first conductive member CP1, and the other end of the plurality of first voltage branch lines DF1 serves as a plurality of output ends of the shunt 123. Herein, the plurality of output ends of the first conductive member CP1 are located on the same side of the first conductive member CP1. The plurality of output ends of the first conductive member CP1 and the input ends of the first conductive member CP1 are located on different sides of the first conductive member CP1.

Furthermore, the current combiner 124 includes a second conductive member CP2, a plurality of second voltage branch lines DF2 and a voltage outlet wire VOUT. Herein, one ends of the plurality of second voltage branch lines DF2 serves as a plurality of input ends of the current combiner 124, and the other ends of the plurality of second voltage branch lines DF2 are connected to the plurality of input ends of the second conductive member CP2. One end of the voltage outlet wire VOUT is connected to an output end of the second conductive member CP2, and the other end of the voltage outlet wire VOUT serves as an output end of the current combiner 124. Herein, the plurality of input ends of the second conductive member CP2 are located on the same side of the second conductive member CP2. The plurality of input ends of the second conductive member CP2 and the output end of the second conductive member CP2 are located on different sides of the second conductive member CP2.

Specifically, with reference to FIG. 6, the first conductive member CP1 and the second conductive member CP2 can be realized by using a metal terminal post with a good power-on capability. The single-phase power supply line is connected to the first conductive member CP1 via the voltage inlet wire VIN. The first conductive member CP1 shunts the current of the voltage inlet wire VIN to a plurality of first voltage branch lines DF1. Herein, the other ends of the plurality of first voltage branch lines DF1 serve as a plurality of output ends of the shunt 123, and are connected to a corresponding plurality of second voltage branch lines DF2 via a plurality of voltage connection lines. Therefore, the divided current can be transmitted to a plurality of second voltage branch lines DF2 of the second conductive member CP2. Subsequently, the second conductive member CP2 combines the currents on the plurality of second voltage branch lines DF2 and outputs the same to the single-phase power supply line via the output end of the second conductive member CP2 and the voltage outlet wire VOUT. In the above process, the current shunt line 121 is composed of a first voltage branch line DF1, a voltage connection line, and a second voltage divider DF2, whereby the shunt 123, the current combiner 124, and a plurality of voltage connection lines realize the function of forming a plurality of current branches.

Optionally, as shown with reference to FIG. 6, a current transformer row can be used to realize the coupling connection between the current transformer LH and the corresponding current branch 121. Here, the current transformer row contains a plurality of current transformers LH of the same structure, the same material and the same parameter index, thus ensuring that the secondary signals of the current transformers LH are the same. Meanwhile, the material, length, thickness and impedance of the conductors of each first voltage shunt line DF1 and the corresponding second voltage branch DF2 can be made the same to ensure that the voltage and current on each current branch are the same.

Alternatively, the plurality of current transformers LH are divided into at least one transformer group, wherein the transformer group includes two current transformers LH symmetrically arranged on both sides of the support plate and having opposite winding directions; and two adjacent current transformers LH located on the same side of the support plate have opposite winding directions.

In particular, a common mode interference signal is usually present in the current signals in the plurality of current branches 121, which affects the value of the current signal measured by the current transformer LH, resulting in inaccurate measurements. Therefore, a plurality of current transformers LH may be arranged in an even number, and at least one transformer group may be divided in a pair-by-pair manner. The transformer group includes two current transformers symmetrically arranged on both sides of the support plate and having opposite winding directions. In a transformer group, since the windings of two current transformers are wound in an opposite manner, common mode interference signals flowing in corresponding voltage dividers can be mutually canceled. Meanwhile, the winding directions of two adjacent current transformers LH on the same side of the support plate are also opposite. Therefore, the two adjacent current transformers LH can also counteract a common mode interference signal flowing in a corresponding voltage shunt line, so that the accuracy of the measured current signal values of a plurality of current transformers LH can be improved.

Figure 7A:
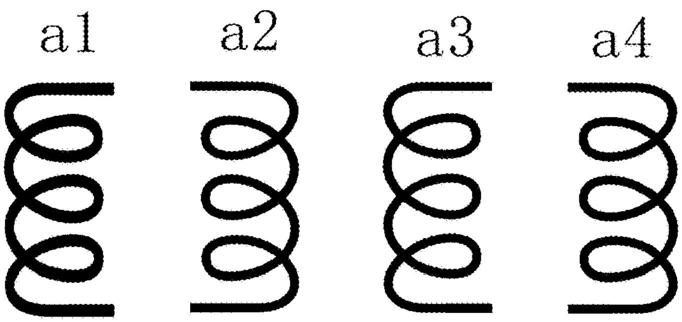
FIGS. 7*a*-7*b* are schematic diagrams of an arrangement form of a plurality of current transformers according to an embodiment of the present disclosure.
Figure 7B:
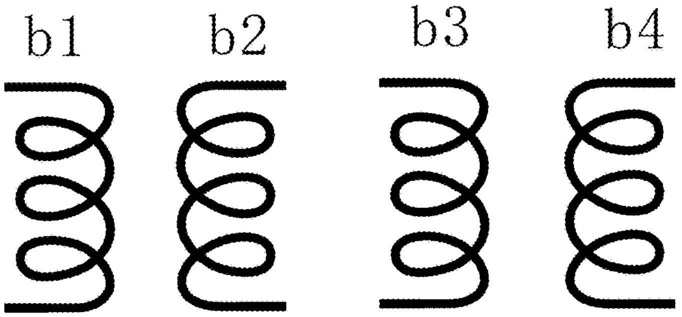

As a specific example, when eight current transformers LH are included in the plurality of current transformers LH, the current transformers LH may be divided into four transformer groups, and the specific arrangement is as shown in FIGS. 7*a*-7*b*. FIG. 7*a* shows a winding method of four current transformers LH on one side of a support plate. FIG. 7*b* shows the winding manner of four current transformers LH on the other side of the support plate. Here, a1 and b1 are a transformer group, and the subsequent grouping is the same. This arrangement can reduce common mode interference signals on multiple voltage shunt lines, thereby improving the measurement accuracy of the current transformers.

The processing of the current signal will now be described by way of examples with a single phase voltage divider 123. Assuming that the current signal value flowing in the voltage inlet wire of the shunt 123 is DL and the shunt 123 outputs n voltage branch lines in total, the following formula (1) can be obtained:

$$DL = DL1 + DL2 + \dots DLn \quad (1)$$

wherein DL1, DL2, . . . , DLn are respectively the current signal values flowing in each voltage shunt line DF1. At this time, the current signal collected by the first current transformer LH is DL1, and the secondary signal of the current transformer LH can be obtained by the following formula (2):

$$DL1K = K1 * DL1 \quad (2)$$

where DL1K is a secondary signal of the first current transformer LH, and K1 is a transformation ratio of the current transformer LH. Likewise, the secondary signal DL2K of the second current transformer LH may be equal to K2*DL2, where K2 is the transformation ratio of the second current transformer LH, DL2 is the current signal collected by the second current transformer LH, and so on for the secondary signals of the remaining current transformers LH. At this time, the output signal of the adder module 1221 can be obtained by the following formula (3):

$$DLKJ = J * (DL1K + DL2K + \dots DLnK) \quad (3)$$

where DLKJ is an output signal of an adder module 1221, DL1K, DL2K, DLnK are secondary signals of n current transformers LH, and J is a linear proportional value of an adder ADD. The signal DLKJ is input to the metering module 130. At this time, if the current transformers LH of the same model and the same processing batch are selected, the transformation ratios of these current transformers LH are the same, and the following formula (4) can be obtained according to the above formulas (1) and (3):

$$DLKJ = J * (DL1K + DL2K +, \dots, DKLn) = J * K1 * (DL1 + DL2 + \dots DLn) = J * K1 * DL \quad (4)$$

where DLKJ is an output signal of the adder module 1221, K1 is a transformation ratio of the current transformer LH, J is a linear proportion value of the adder ADD, and DL is a current signal value flowing in the shunt voltage inlet wire. The linear proportion value of the transformation ratio of the current transformer LH to the adder ADD is constrained and fixed by the circuit device characteristics, and the numerical value thereof can be measured during the correction flow in the production stage and stored in the metering module 130. Therefore, the signal DLKJ input to the metering module is linearly related to the current signal DL, so that the metering module 130 can measure the actual current value DL on the single-phase power supply line.

Figure 8:
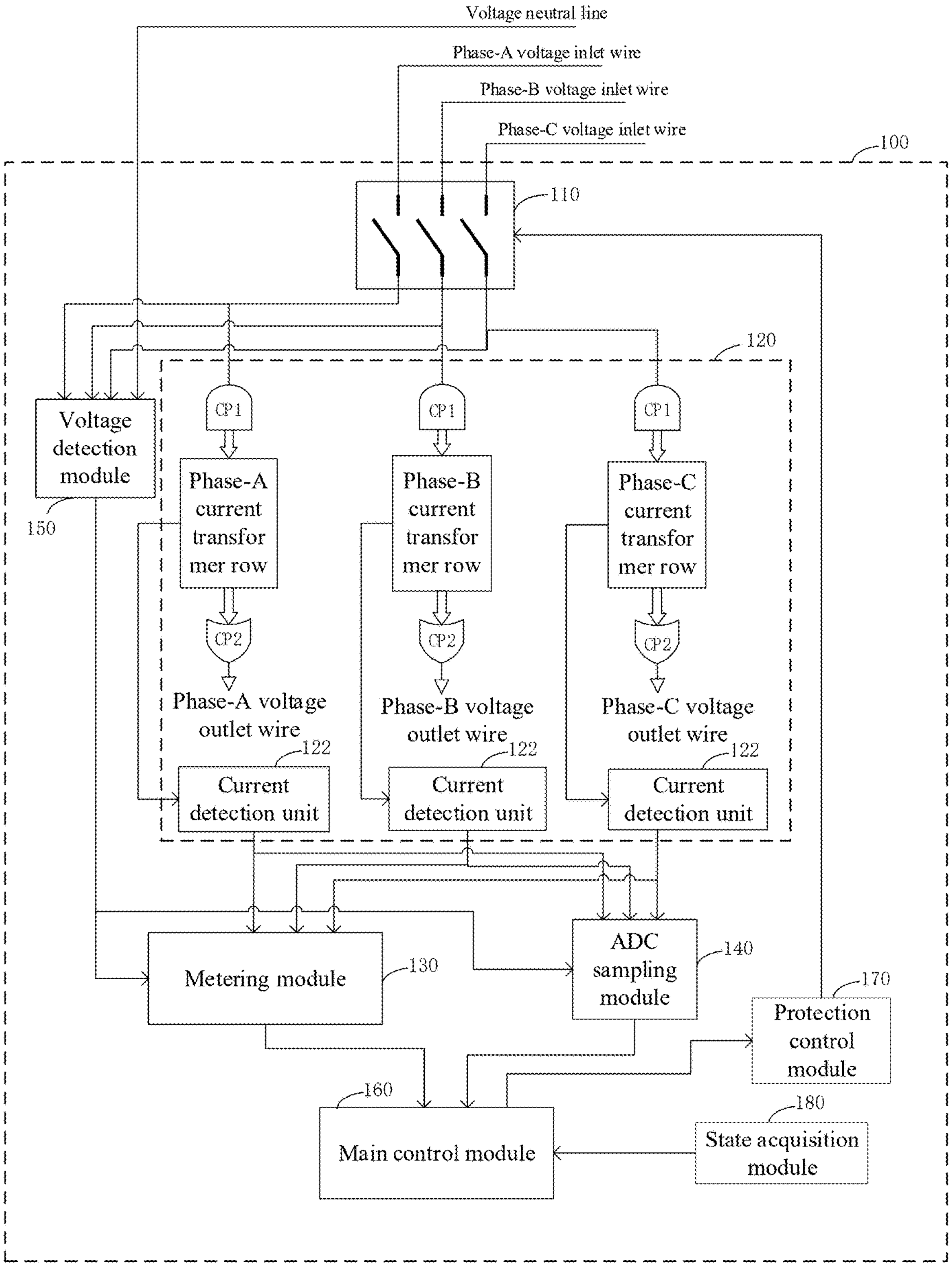
FIG. 8 is a schematic structural diagram of a low-voltage distribution switch according to another embodiment of the present disclosure.

In some embodiments, with reference to FIG. 8, the low-voltage distribution switch 100 further includes an ADC sampling module 140. The ADC sampling module 140 is connected to the plurality of current detection units 122. The ADC sampling module 140 is configured for sampling the plurality of current detection signals to obtain a plurality of current sampling signals so as to perform power supply protection based on the plurality of current sampling signals.

Further, the low-voltage distribution switch 100 further includes a voltage detection module 150. A plurality of input ends of the voltage detection module 150 are connected to a plurality of output ends of the switch module 110 and a neutral line inlet end of the low-voltage distribution switch 100. The neutral line inlet end is suitable for being connected to a neutral line of the power supply line. The voltage detection module 150 is configured for detecting the voltage of each phase power supply line in a multi-phase power supply line to obtain the plurality of voltage detection signals. The metering module 130 is further connected to the voltage detection module 150. The metering module 130 is further configured for sampling a plurality of voltage detection signals, calculating a plurality of first voltages according to the plurality of voltage detection signals, and determining first electrical energy metering data based on the plurality of first currents and the plurality of first voltages. The ADC sampling module 140 is further connected to the voltage detection module 150. The ADC sampling module 140 is further configured for sampling the plurality of voltage detection signals to obtain a plurality of voltage sampling signals so as to perform power supply protection based on the plurality of current sampling signals and the plurality of voltage sampling signals.

Specifically, the voltage detection module 150 may be a voltage detection device such as a three-phase voltage transformer. As shown in FIG. 8, the voltage detection module 150 is respectively connected to a plurality of output ends of the switch module 110 and a neutral line input end of the low-voltage distribution switch 100 so as to detect the voltage of each phase power supply line of a multi-phase power supply line to obtain a plurality of voltage detection signals. At this time, the metering module 130 may sample the plurality of voltage detection signals to obtain a plurality of first voltages, where the first voltages refer to voltage values of each phase power supply line. Subsequently, the metering module 130 may calculate and obtain corresponding first electric energy metering data according to the determined plurality of first currents and first voltages to realize the electric energy metering function.

Meanwhile, with continuing reference to FIG. 8, the ADC sampling module 140 may be connected to the plurality of current detection units 122 and the voltage detection module 150, respectively, to sample the plurality of current detection signals and the plurality of voltage detection signals so as to obtain the plurality of current sampling signals and the plurality of voltage sampling signals. These sampled signals can provide data support for power protection of the low-voltage distribution switch 100, thereby improving the safety of the low-voltage distribution switch 100. The power supply protection may include over-voltage protection, over-current protection, island protection, etc. and the specific protection principle is not expanded here.

Alternatively, the ADC sampling module 140 may adopt the AD7606 chip, which has 16 encoding bits and a sampling rate of up to 100 k, and can meet the various sampling requirements of the ADC sampling module implemented in the present disclosure.

In some embodiments, the low-voltage distribution switch 100 further includes a main control module 160 connected to the metering module 130 and the ADC sampling module 140, wherein the main control module 160 is configured for acquiring the first electric energy metering data from the metering module 130 when the metering module 130 has not failed, acquiring the plurality of current sampling signals and the plurality of voltage sampling signals from the ADC sampling module 140 when the metering module 130 fails, and determining the first electrical energy metering data based on the plurality of current sampling signals and the plurality of voltage sampling signals; the main control module 160 is also configured for acquiring the plurality of current sampling signals and the plurality of voltage sampling signals from the ADC sampling module 140 when the ADC sampling module 140 has not failed, so as to perform power supply protection based on the plurality of current sampling signals and the plurality of voltage sampling signals; when the ADC sampling module 140 fails, acquiring the plurality of first currents and the plurality of first voltages from the metering module 130 so as to perform power supply protection based on the plurality of first currents and the plurality of first voltages.

Specifically, referring to FIG. 8, when both the metering module 130 and the ADC sampling module 140 are normal, the main control module 160 acquires first electric energy metering data from the metering module 130 to realize an electric energy metering function, acquires a plurality of current sampling signals and a plurality of voltage sampling signals from the ADC sampling module 140, and performs power supply protection on the low-voltage distribution switch 100 based on performing analysis on the plurality of current sampling signals and the plurality of voltage sampling signals. When the metering module 130 fails, the main control module 160 can acquire the plurality of current sampling signals and the plurality of voltage sampling signals from the ADC sampling module 140 and determine the first electrical energy metering data based on the plurality of current sampling signals and the plurality of voltage sampling signals. When the ADC sampling module 140 fails, the plurality of first currents and first voltages may be acquired from the metering module 130 when the ADC sampling module 140 fails to provide power supply protection based on the plurality of first currents and the plurality of first voltages.

In the foregoing embodiments, when the ADC module 140 fails, the power supply protection function of the low-voltage distribution switch 100 fails. When the metering module 130 fails, the power metering function of the low-voltage distribution switch 100 is incorrect, thereby causing a safety hazard or functional failure to the low-voltage distribution switch 100. However, in the embodiment of the present disclosure, when one of the metering module 130 or the ADC sampling module 140 fails, the main control module 160 can realize the two functions of electric energy metering and power supply protection based on the voltage signal and current signal collected by the normal module, so that when the maintenance personnel arrives at the field for maintenance and replacement, the low-voltage power supply switch 100 does not lose a certain function to bring a safety risk to the low-voltage power supply switch 100. Therefore, the low-voltage distribution switch of the embodiment of the present disclosure has higher reliability.

Thus, by providing the main control module in the low-voltage distribution switch, when one of the metering module or the ADC sampling module fails, the main control module can enable the normal module to realize the functions of electric energy metering and power supply protection at the same time, so that the metering module and the ADC sampling module can backup each other, thereby effectively improving the reliability of the low-voltage distribution switch.

In some embodiments, the main control module 160 is further configured for acquiring a plurality of voltage sampling signals from the ADC sampling module 140, acquiring a plurality of first voltages from the metering module 130, and determining whether the metering module 130 and the ADC sampling module 140 fail based on the plurality of voltage sampling signals and the plurality of first voltages.

Further, the main control module 160 is configured for calculating a plurality of second voltages according to the plurality of voltage sampling signals, acquiring a voltage difference value between each of the first voltages and the corresponding second voltage to obtain a plurality of voltage difference values, and determining whether the metering module 130 and the ADC sampling module 140 fail based on the plurality of first voltages and the plurality of second voltages when any voltage difference value in the plurality of voltage difference values is greater than or equal to a first preset voltage difference value threshold.

Specifically, the first preset voltage difference value threshold represents the maximum voltage difference between the metering module 130 and the ADC sampling module 140 due to measurement error. For example, the first preset voltage difference value threshold may be 2%. When both the metering module 130 and the ADC sampling module 140 are normal, a plurality of second voltages calculated by the main control module 160 according to the voltage sampling signal should be the same as the corresponding first voltages or have a small difference. Therefore, the main control module 160 may acquire a plurality of voltage difference values between each first voltage and the corresponding second voltage. When any voltage difference value in the plurality of voltage difference values is greater than or equal to a first pre-set voltage difference value threshold, it is determined that at least one module fails in the metering module 130 and the ADC sampling module 140. At this moment, the plurality of voltage sampling signals and the plurality of first voltages may be further analyzed to determine whether the metering module 130 and the ADC sampling module 140 are disabled, enabling the main control module to perform the mutual backup function of the metering module and the ADC sampling module.

In some embodiments, the main control module 160 is configured for determining whether the metering module 130 and the ADC sampling module 140 fail based on at least one of a DC component, a magnitude, a waveform distortion, a power, a power factor, a frequency, and a phase sequence corresponding to the plurality of first voltages and the plurality of second voltages.

Specifically, when it is determined that at least one of the metering module 130 and the ADC sampling module 140 has failed, the main control module 160 may perform failure source determination, i.e., determining whether the metering module 130 and the ADC sampling module 140 have failed by determining whether the plurality of first voltages and the plurality of second voltages meet preset requirements in terms of direct current component, amplitude, waveform distortion, power, power factor, frequency and phase sequence, so that the main control module enables the normal module to achieve the functions of electric energy metering and power supply protection at the same time.

Furthermore, the main control module 160 is configured for determining that the metering module 130 fails when the direct current component of the first voltage is greater than the preset direct current component; and determining that the ADC sampling module 140 fails when the DC component of the second voltage is greater than the preset DC component.

Specifically, the pre-set direct current component is configured for distinguishing whether the direct current component in the first current and the second current is zero. Since the normal first voltage and the second voltage are alternating current signals, the direct current component should be zero. Therefore, when the direct current component of the first voltage is greater than the pre-set direct current component, it is determined that the metering module 130 fails. When the DC component of the second voltage is greater than the preset DC component, it is determined that the ADC sampling module 140 fails. Thereby, it achieves the function of determining whether the metering module and the ADC sampling module fail based on the direct current components of the first voltage and the second voltage.

Furthermore, the main control module 160 is configured for determining that the metering module 130 fails when the amplitude of the first voltage is not within the preset amplitude range; determining that the ADC sampling module 140 fails when the amplitude of the second voltage is not within the preset amplitude range.

In particular, the preset amplitude range is determined on the basis of the normal voltage effective value range of the multi-phase supply line. For example, the preset amplitude range is 120V to 320V when the multi-phase supply line is a 220 v three-phase alternating current supply. Therefore, when the amplitude of the first voltage or the amplitude of the second voltage is not within the preset amplitude, it can be determined that the corresponding metering module or the ADC sampling module fails, so as to realize the function of determining whether the metering module and the ADC sampling module fail based on the amplitudes of the first voltage and the second voltage.

Furthermore, the main control module 160 is configured for determining that the metering module 130 fails when the waveform distortion of the first voltage is greater than a first preset distortion, or the waveform distortion of the first voltage is greater than the waveform distortion of the second voltage, and the difference value between the waveform distortion of the first voltage and the waveform distortion of the second voltage is greater than a second preset distortion; determining that the ADC sampling module 140 fails when the waveform distortion of the second voltage is greater than the first preset distortion, or the waveform distortion of the second voltage is greater than the waveform distortion of the first voltage, and the difference value between the waveform distortion of the second voltage and the waveform distortion of the first voltage is greater than the second preset distortion.

Specifically, the first preset distortion is a maximum possible distortion of the first voltage and the second voltage in consideration of transmission loss of the line and noise interference. For example, the first preset distortion may be 40%. When the metering module 130 and the ADC sampling module 140 are normal, the waveform distortion of the first voltage and the second voltage should be less than the first preset distortion. Therefore, when the waveform distortion of the first voltage is greater than the first preset distortion, it can be determined that the metering module 130 fails. When the waveform distortion of the second voltage is greater than the first preset distortion, it may be determined that the ADC sampling module 140 fails.

The second preset distortion represents the maximum possible difference value of the distortion of the first voltage and the second voltage in consideration of the sampling error. For example, the second preset distortion may be 10%. Since the sampling environments of the metering module 130 and the ADC sampling module 140 are the same, the waveform distortions of the first voltage and the second voltage should be similar, namely, the difference between the waveform distortions of the two should be less than the second preset distortion. If the difference value between the waveform distortions of the both exceeds the second preset distortion, it can be determined that the module corresponding to the voltage with the greater waveform distortion fails. Therefore, when the waveform distortion of the first voltage is greater than the waveform distortion of the second voltage, and the difference value between the waveform distortion of the first voltage and the waveform distortion of the second voltage is greater than a second preset distortion, it can be determined that the metering module 130 fails. Alternatively, the ADC sampling module 140 may be determined to be disabled when the waveform distortion of the second voltage is greater than the waveform distortion of the first voltage and the difference value between the waveform distortion of the second voltage and the waveform distortion of the first voltage is greater than a second preset distortion. Thus, it achieves the function of determining whether the metering module and the ADC sampling module fail based on the waveforms of the first voltage and the second voltage.

Furthermore, the main control module 160 is configured for determining that the metering module 130 fails when the first power corresponding to the first voltage is negative, and determining that the ADC sampling module 140 fails when the second power corresponding to the second voltage is negative.

Specifically, since the voltage and current directions are the same at normal power supply, the power calculated from the first voltage and the second voltage is also positive. Therefore, when the first power corresponding to the first voltage is a negative number, indicating that the first voltage is in a reverse direction with the corresponding first current at the moment, it can be determined that the metering module 130 fails. Similarly, when the second power corresponding to the second voltage is negative, it may be determined that the ADC sampling module 140 fails. Thus, it achieves the function of determining whether the metering module and the ADC sampling module have failed based on the power corresponding to the first voltage and the second voltage.

In some embodiments, the main control module 160 is configured for determining that the metering module 130 fails when a first power factor corresponding to the first voltage is less than a preset power factor, and determining that the ADC sampling module 140 fails when the second power factor corresponding to the second voltage is less than the preset power factor.

Specifically, the preset power factor refers to the lowest value of the power factor of the first voltage and the second voltage in the case where the low-voltage distribution switch 100 is normal. For example, the preset power factor may be 0.6. Therefore, when the first power factor corresponding to the first voltage or the second power factor corresponding to the second voltage is less than the preset power factor, it can be determined that the corresponding metering module 130 or the ADC sampling module 140 fails. Thus, it achieves the function of determining whether the metering module and the ADC sampling module have failed based on the first power factor corresponding to the first voltage and the second voltage.

Furthermore, the main control module 160 is configured for determining that the ADC sampling module 140 fails when the frequency difference value between the frequency of the first voltage and the preset frequency is less than the frequency difference value between the frequency of the second voltage and the preset frequency, and the frequency difference between the frequency of the second voltage and the frequency of the first voltage is greater than the preset frequency difference; determining that the metering module 130 fails when the frequency difference value between the frequency of the second voltage and the preset frequency is less than the frequency difference value between the frequency of the first voltage and the preset frequency, and the frequency difference value between the frequency of the first voltage and the frequency of the second voltage is greater than the preset frequency difference.

In particular, the preset frequency refers to the operating frequency of the multi-phase power supply line. For example, the preset frequency may be 50 Hz. The preset frequency difference value refers to the maximum possible frequency difference value between the first voltage frequency and the second voltage frequency due to measurement errors. For example, when the frequency measurement accuracy is 0.01 Hz, the preset frequency difference value may be 0.5 Hz. When the metering module 130 or the ADC sampling module 140 is normal, either the first voltage frequency or the second voltage frequency should be close to the preset frequency, and the difference value between the first voltage frequency and the second voltage frequency should be less than the preset frequency difference value. Therefore, when the frequency difference value between the frequency of the first voltage and the preset frequency is less than the frequency difference value between the frequency of the second voltage and the preset frequency, it indicates that the frequency of the first voltage is closer to the preset frequency. At this moment, if the frequency difference value between the frequency of the second voltage and the frequency of the first voltage is greater than the preset frequency difference, it indicates that there is a sampling error problem in the ADC sampling module 140 corresponding to the second voltage. At this moment, it can be determined that the ADC sampling module 140 fails. Similarly, when the frequency difference between the frequency of the second voltage and the preset frequency is less than the frequency difference value between the frequency of the first voltage and the preset frequency, indicating that the frequency of the second voltage is closer to the preset frequency, it may be determined that the metering module 130 fails if the frequency difference value between the frequency of the first voltage and the frequency of the second voltage is greater than the preset frequency difference value. Thus, it achieves the function of determining whether the metering module and the ADC sampling module have failed based on the frequency of the first voltage and the second voltage.

Furthermore, the main control module 160 is configured for determining that the metering module 130 fails when the phase sequence of the plurality of first voltages is different from the preset phase sequence; and determining that the ADC sampling module 140 fails when the phase sequence of the plurality of second voltages is different from the preset phase sequence.

In particular, the preset phase sequence refers to the phase sequence of the multi-phase power supply line. For example, when the multi-phase power supply line supplies 220 v of three phases, the phase sequence of ABC three phases should be such that the phase of the A phase voltage is 120 degrees ahead of the phase of the B phase voltage, and the phase of the B phase voltage is 120 degrees ahead of the phase of the C phase voltage. Therefore, when the phase sequence determined by the plurality of first voltages is different from the preset phase sequence, it indicates that the metering module 130 fails. Also, when the phase sequence determined by the plurality of second voltages is different from the preset phase sequence, it indicates that the metering module 130 fails. Thus, it achieves the function of determining whether the metering module and the ADC sampling module fail based on the corresponding phase sequence of the first voltage and the second voltage.

Alternatively, when it is determined that there is a failure module in the metering module 130 and the ADC sampling module 140, and it cannot be determined which one of the metering module 130 and the ADC sampling module 140 has failed by the above-mentioned direct current component, amplitude, waveform distortion, power, power factor, frequency and phase sequence method. The metering module 130 can be directly considered to have a failure, because a large amount of empirical data shows that the metering module 130 is more likely to fail.

In some embodiments, a first frequency at which the main control module 160 acquires the plurality of first currents and the plurality of first voltages from the metering module 130 is less than a second frequency at which the plurality of current sampling signals and the plurality of voltage sampling signals are acquired from the ADC sampling module, wherein the main control module 160 is further configured for performing power supply protection based on the plurality of first currents, the plurality of first voltages and the first frequency when the ADC sampling module 140 fails.

In particular, since the metering module 130 is mainly used for the electric energy metering function, and the real-time requirement is inferior to that of the power supply protection function, the first frequency at which the main control module 160 acquires a plurality of first currents and a plurality of first voltages from the metering module 130 may be less than the second frequency at which the ADC sampling module 140 acquires a plurality of current sampling signals and a plurality of voltage sampling signals. For example, the period corresponding to the first frequency is usually greater than 0.8 s, and the period corresponding to the second frequency is usually in the order of milliseconds. Therefore, when the ADC sampling module 140 fails and the main control module 160 performs power supply protection via a plurality of first voltages and first currents in the metering module 130, such as over-voltage protection, it is necessary to determine an over-voltage of the multi-phase power supply line after the first voltage is greater than the over-voltage threshold and lasts for a pre-set period of time, and the over-voltage protection needs high sampling frequency support of the ADC sampling module 140. Therefore, when the main control module 160 performs power supply protection, it is necessary to consider the first frequency at the same time to realize the power supply protection function so as to improve the power supply protection function for the multi-phase power supply line.

Taking the over-voltage protection as an example, assuming that the period corresponding to the first frequency is 1 s, the over-voltage protection is performed on the multi-phase power supply line when the pre-set duration in the over-voltage protection is less than 1 s and the main control module 160 detects that the first voltage is higher than the pre-set voltage threshold, so as to ensure the safety of the multi-phase power supply line. When the pre-set time in the over-voltage protection is greater than 1 s, after the main control module 160 detects that the first voltage is higher than the pre-set voltage threshold for a pre-set period of time, the main control module 160 performs over-voltage protection on the multi-phase power supply line so as to avoid an erroneous over-voltage protection.

Optionally, when the metering module fails, the main control module 160 is required to calculate the corresponding active power and reactive power based on the plurality of voltage sampling signals and current sampling signals sampled by the ADC sampling module 140, and determine the corresponding sampling time based on the second frequency. Then, the active power is accumulated according to the sampling time to obtain the active electric energy, and the reactive power is accumulated according to the sampling time to obtain the reactive electric energy, so as to realize the electric energy metering function by the ADC sampling module.

In some embodiments, the main control module 160 is further configured for modifying the plurality of first voltages and the plurality of first currents based on a ratio of the second voltage to the first voltage when each of the plurality of voltage difference values is less than the first preset voltage difference value threshold and greater than a second preset voltage difference value threshold, wherein the second preset voltage difference value threshold is less than the first preset voltage difference value threshold.

Specifically, the first preset voltage difference value threshold is configured for determining whether the error between the metering module 130 and the ADC sampling module 140 is too large. The second preset voltage difference value threshold is configured for determining whether there is an error between the first voltage and the second voltage. Therefore, the second preset voltage difference value threshold is less than the first preset voltage difference value threshold. For example, the first preset voltage difference value threshold may be 2%, and the second preset voltage difference value threshold may be 0.5%. When each voltage difference value between a plurality of first voltages and corresponding second voltages is less than the first preset voltage difference value threshold and greater than the second preset voltage difference value threshold, it indicates that both the metering module 130 and the ADC sampling module 140 are working normally at this moment, but there is a certain error. At the same time, since the temperature coefficient of the signal processing channel of the ADC sampling module 140 is small, the error of sampling by the ADC sampling module 140 is also relatively small, and the sampling data is also more accurate. Therefore, at this time, the plurality of first voltages and the plurality of first currents can be corrected on the basis of the ratio of the second voltage to the first voltage, i.e., multiplying the sampled first voltage and first current by the ratio of the second voltage to the first voltage as a final first voltage and first current, and performing electric energy metering at the final first voltage and first current. This method can improve the accuracy of the first voltage and first current obtained by the metering chip sampling, thereby effectively improving the accuracy of the electric energy metering function.

In some embodiments, the main control module 160 is further configured for analyzing the first electric energy metering data to obtain second electric energy metering data.

Specifically, the second electric energy metering data includes accumulated electric energy, time-period electric energy, settlement date electric energy, etc. After the first electric energy metering data is determined by the metering module 130, the main control module 160 may also obtain second electric energy metering data based on the first electric energy metering data for subsequent further statistical analysis on the electric energy metering data, including electric energy accumulation, freezing, four-quadrant analysis, etc. thereby improving the convenience of the electric energy metering function.

In some embodiments, with reference to FIG. 8, the low-voltage distribution switch 100 further includes: a protection control module 170, wherein the protection control module 170 is connected to the switch module 110 for controlling the switch module 110; wherein the main control module 160 is further connected to the protection control module 170; the main control module 160 is further configured for generating a protection signal and sending same to the protection control module 170 according to the plurality of current sampling signals and the plurality of voltage sampling signals, or according to the plurality of first currents and the plurality of first voltages, so that the protection control module 170 controls the switch module 110 for disconnection to provide power supply protection based on the protection signal.

Specifically, when the main control module 160 determines that the multi-phase power supply line is in a dangerous power supply condition, such as over-voltage and over-current, based on the sampling data of the ADC sampling module 140 or the metering module 130, the main control module 160 generates a protection signal to be sent to the protection control module 170, and then the protection control module 170 controls the switch module 110 to be switched off, thereby achieving power supply protection for the multi-phase power supply line.

In some embodiments, as shown with reference to FIG. 8, the low-voltage distribution switch 100 further includes a state acquisition module 180, wherein the state acquisition module 180 is connected to the switch module 110 and the main control module 160, and the state acquisition module 180 is configured for acquiring a switch state and/or a power supply protection mode of the switch module 110 and sending same to the main control module 160.

Specifically, the state acquisition module 180 is configured for acquiring various state shift signals of the low-voltage distribution switch 100 and sending same to the main control module 160 so that the main control module 160 controls the low-voltage distribution switch, wherein the state shift signals may include an on-off state of the switch module 110, a manual or automatic state of the power supply protection module, etc.

Figure 9:
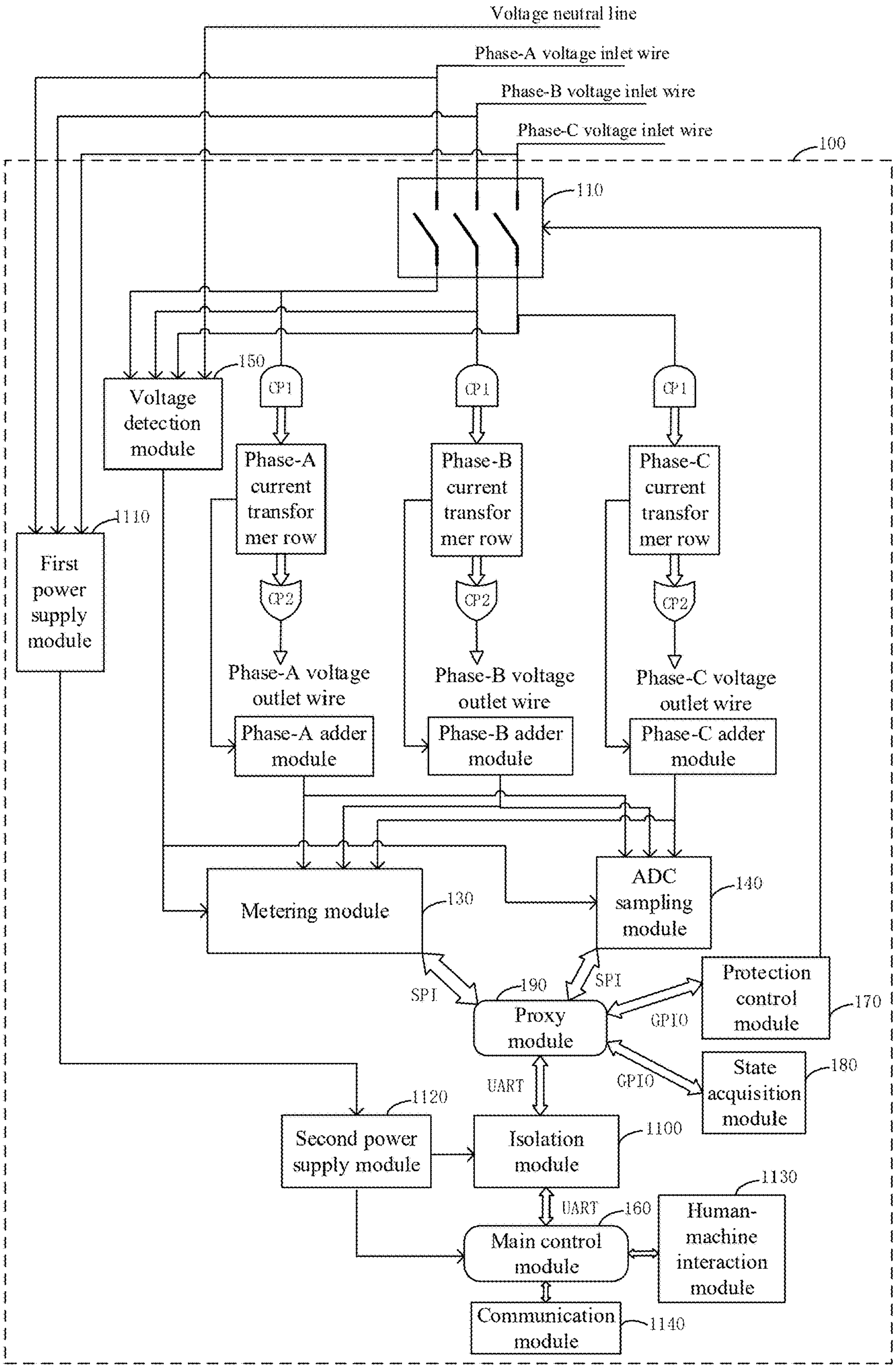
FIG. 9 is a schematic structural diagram of a low-voltage distribution switch according to yet another embodiment of the present disclosure.

In some embodiments, as shown with reference to FIG. 9, the low-voltage distribution switch 100 further includes a proxy module 190 and an isolation module 1100, wherein the proxy module 190 is connected to the metering module 130, the ADC sampling module 140, the protection control module 170, the state acquisition module 180 and the isolation module 1100; the isolation module 1100 is connected to the main control module 160, wherein the proxy module 190 is configured for acquiring the first electric energy metering data, a plurality of first voltages, the plurality of first currents, the plurality of voltage sampling signals, the plurality of current sampling signals and the switch state and/or the power supply protection mode, sending same to the main control module 160 via the isolation module 1100, and receiving the protection signal via the isolation module and sending same to the protection control module.

Figure 10:
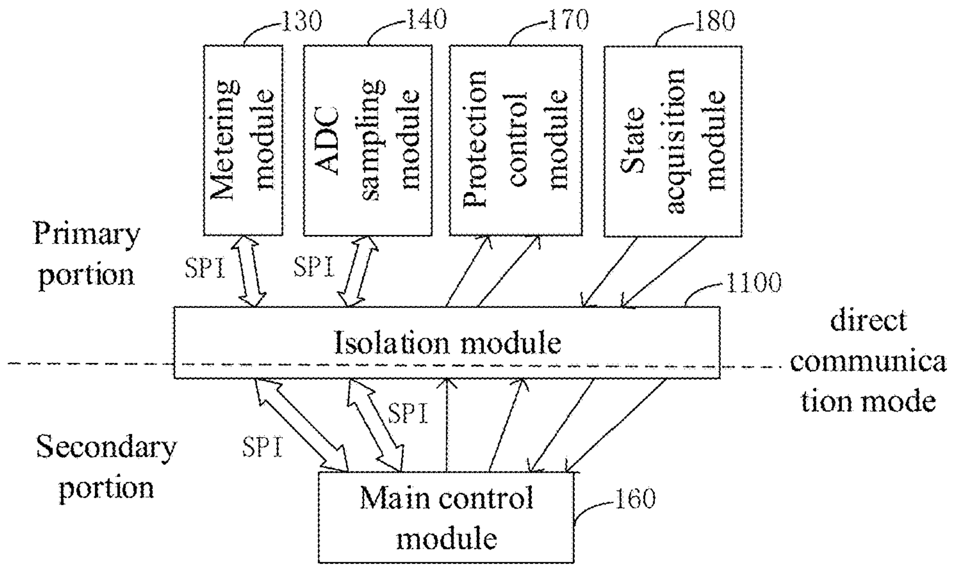
FIG. 10 is a schematic connection diagram of a main control module in a direct communication mode according to an embodiment of the present disclosure.

Specifically, with reference to FIG. 9, in the low-voltage distribution switch 100, the data acquisition and calculation functions in the metering module 130 and the ADC sampling module 140, the protection control module 170 and the state acquisition module 180 are simple, regular and real-time. Therefore, the running clock can use the frequency of a low-frequency clock to improve electromagnetic immunity. Also, these modules are required to carry high voltage or high current or strong electromagnetic fields, and can be installed close to the sampling device to improve the reliability of data communication. These modules can be divided into a primary portion, and operators need to take isolation measures when contacting this primary portion of the module. However, in the low-voltage distribution switch 100, the main control module 160 is a calculation core and is required to bear complex calculation and analysis tasks. Thus, the frequency of running a clock is relatively high. At the same time, the main control module 160 is also required to bear data management and storage functions. Thus, it also has relatively high safety requirements for the main control module 160. In addition, a low-voltage voltage is generally used by the main control module 160 to supply power. Thus, it can be electrically plugged and plugged, and the main control module 160 can be divided into a secondary portion. It can be seen from the above that the requirements for the working environment of the primary portion and the secondary portion in the low-voltage distribution switch 100 and the requirements for the safety of operator contact are not consistent. Therefore, the isolation module 1100 may be provided between the two parts to meet the requirements for the working environment of the two parts at the same time and protect the safety of operation of personnel, as shown in FIG. 10.

Figure 11:
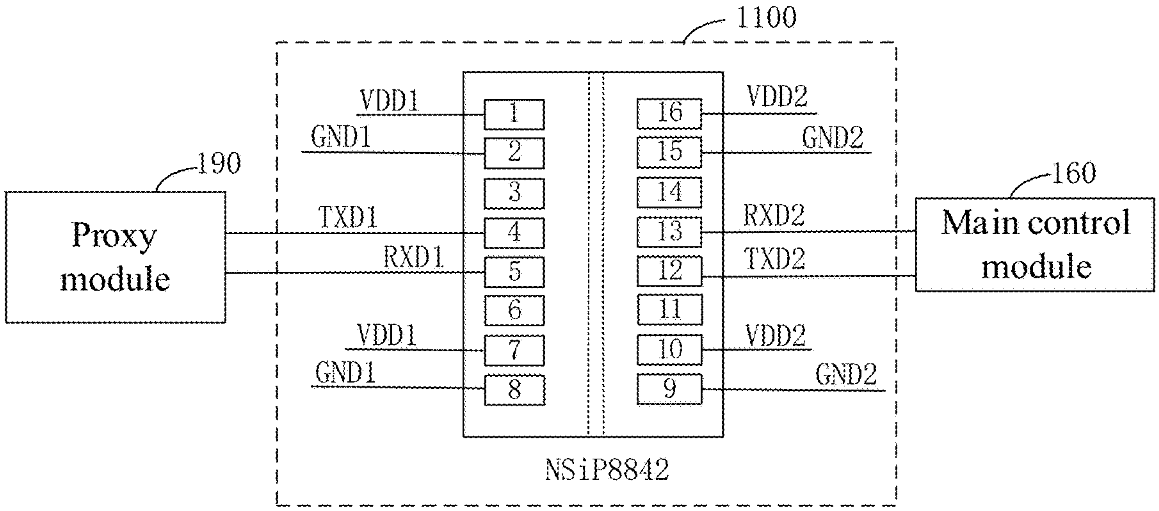
FIG. 11 is a schematic structural diagram of an isolation module according to an embodiment of the present disclosure.

For example, the NSiP8842 chip (hereinafter referred to as an NS chip) shown in FIG. 11 can be used as an isolation module 1100 to realize the isolation function of a high-frequency operation portion and a low-frequency operation portion. The NS chip is a digital isolation chip integrated with an isolated DC/DC power supply. The communication rate is up to 150 Mbps, an isolation transformer is built in, and the isolation voltage is up to 4500 volts, which can satisfy the isolation communication requirements of an embodiment of the present disclosure. With reference to FIG. 11, a pin 1 and a pin 7 in the NS chip are a first direct-current power supply VDD1 and configured for supplying power to a primary portion of the NS chip, and a pin 2 and a pin 8 are a first ground terminal GND1 corresponding to a first direct current power supply VDD1. A pin 4 and a pin 5 are a sending port TXD1 and a receiving port RXD1 of the primary portion. A pin 10 and a pin 16 are a second pre-set power supply VDD2 for supplying power to the secondary portion, and the second pre-set power supply VDD2 can be coupled from the first pre-set power supply VDD1. A pin 9 and a pin 15 are a second ground terminal GND2 corresponding to the second pre-set power supply VDD2. A pin 12 and a pin 13 are a sending port TXD2 and a receiving port RXD2 of the secondary portion, respectively. It can be seen therefrom that the NS can achieve the isolation function of two communication lines. However, in the embodiment of the present disclosure, as shown in FIG. 10, the metering module 130 and the ADC sampling module 140 are required to communicate with the main control module 160 via a SPI (serial peripheral interface). Each SPI interface needs four communication lines for communication, while the protection control module 170 and the state acquisition module 180 need a total of four GPIO (general purpose input output) ports to achieve communication with the main control module 160. Therefore, if the main control module 160 directly communicates with the modules of the low-frequency operation portion, such as the metering module 130, via the isolation module 1100, at least 12 communication lines are required. Therefore, 6 NS chips are required to realize the isolation function, which results in high cost and a large number of wiring harnesses of the low-voltage distribution switch 100. This is not conducive to the design of the isolation structure. Accordingly, as shown with reference to FIG. 9, the low-voltage distribution switch 100 according to an embodiment of the present disclosure further includes a proxy module 190. The proxy module 190 is connected to the metering module 130 and the ADC sampling module 140 via the SPI, and is connected to the protection control module 170 and the state acquisition module 180 via the GPIO port. Meanwhile, the proxy module 190 is also connected to the main control module 160 via the isolation module 1100. Since most of the data of the first electric energy metering data, the plurality of first voltages, the plurality of first currents, the plurality of voltage sampling signals, the plurality of current sampling signals and the switch state and/or the power supply protection mode data which are collected at by the primary portion have low requirements for real-time communication, low-speed communication can meet the requirements. Therefore, the low-speed communication data of these parallel interfaces can be packaged into high-speed serial data, and the data transmission is performed by means of UART communication (universal asynchronous receiver transmitter) in order to save interfaces. For example, the proxy module 190 may communicate with the main control module 160 via two communication lines in a UART communication manner, in which case the proxy module 190 requires only two communication lines to achieve the full communication requirements of the main control module 160. Thus, only one NS chip may be used as the isolation module 1100, as shown in FIG. 11. With reference to FIG. 11, the proxy module 190 and the isolation module 1100 at this moment can not only realize the isolation communication function of the primary portion and the secondary portion, but also ensure the integrity of communication data, so that the setting of isolation devices in the isolation module can be reduced, and the cost and design difficulty of the isolation structure can be reduced.

Thus, by providing the proxy module and the isolation module in the low-voltage distribution switch, the isolated communication function of the internal primary portion and secondary portion can be realized. Meanwhile, the arrangement of the isolation device is saved, which facilitates the design of the electrical isolation structure and improves the safety of the operator.

Further, the proxy module transmits the data of the metering module 130 with a lower priority than that of the data of the ADC sampling module 140 and with a higher priority than that of the data of the state acquisition module.

Specifically, among the data of the measurement module 130, the data of the ADC sampling module 140, and the data of the state acquisition module, the transmission priority of the proxy module may be determined based on the influence of the data on real-time requirements and security. The data of the ADC sampling module 140 is mainly configured for the main control module 160 to perform power supply protection on the multi-phase power supply line, which has a higher requirement for real-time performance and a higher impact on security. Therefore, the data priority of the ADC sampling module 140 is the highest. Meanwhile, when the ADC sampling module 140 fails, the data of the metering module 130 is also configured for power supply protection on the multi-phase power supply line. Therefore, the priority of the data of the metering module 130 is lower than the data of the metering module 130, but higher than the data of the state acquisition module 180. Finally, the data of the state acquisition module 180 mainly includes switch state and/or power supply protection mode data, and these data have low requirements for real-time performance and have little effect on the security of the multi-phase power supply line. Therefore, the data transmission priority of the state acquisition module 180 can be the lowest.

As a specific example, when the multi-phase power supply line supplies power to 220*v* of a three-phase four-wire system, the main control module 160 and the proxy module 190 may communicate as follows.

In the proxy module 190, the proxy module 190 can periodically and continuously read the sampling data of the ADC module 130 via the SPI interface. In the power frequency period of each multi-phase power supply line, the voltage/current signal can be uniformly sampled at 128 points, and the sampling frequency is 6400 Hz. In each sampling period, each time a position of 64 points (about 10 milliseconds) is sampled, the proxy module 190 sends the sampled voltage sampling signal and current sampling signal (hereinafter referred to as sampling data) to the main control module 160. Secondly, the proxy module 190 communicates with the metering module 130 once every 1 second to acquire a first voltage and a first current (hereinafter referred to as metering data) sampled by the metering module 130. Meanwhile, when the proxy module 190 does not send the sampling data, the metering data is sent to the main control module. Finally, when the low-voltage distribution switch 100 shifts in state, the state change data is firstly cached. When the proxy module 190 does not send data, the proxy module 190 sends the state change data. When the proxy module 190 is transmitting data, the proxy module 190 retransmits the state shift data to the main control module 160 when the transmission of the data ends. In addition, each of the above data is not interrupted during transmission to ensure reliability of the data transmission.

In the main control module 160, each time the main control module 160 receives 64 sampling data, the main control module 160 buffers these sampling data, calculates a voltage effective value, a current effective value and a frequency value at this time according to these sampling data and the 64 sampling data of the previous group, and then performs over-voltage, over-current and over-frequency analysis. When a fault such as over-voltage and over-current is judged, the main control module 160 sends a control command to the proxy module 190. After receiving the control command, the proxy module 190 immediately drives the protection control module 170 to perform a corresponding action so as to achieve power supply protection for the multi-phase power supply line. Meanwhile, when the main control module 160 receives a set of measurement data, the main control module 160 performs an electric energy statistical analysis, including electric energy accumulation, freezing, four-quadrant analysis, etc.

In the communication mode of the embodiment of the present disclosure, the communication rate of the proxy module 190 and the main control module 160 may be set to 2 Mbps. At this time, the communication time of every 64 sample data is $64*16*6/2M \approx 3$ msec (64 represents the number of sample data, 16 represents that each signal in each sample data is 16 bits, 6 represents that three voltage signals and three current signals are included in each sample data, and 2M represents the current communication rate). However, it can be seen from the above that the proxy module 190 of the embodiment of the present disclosure performs the function of transmitting sampling data once every 10 milliseconds. Therefore, after each time of sending sampling data, the proxy module 190 has an idle time of 7 milliseconds for sending metering data or state shift data. Assuming that the metering data includes eight types of data, namely, a forward active electric energy value, a reverse active electric energy, a forward reactive electric energy, a reverse reactive electric energy, a voltage value, a current value, an active power and a reactive power, the communication of the metering data is $8*24*3/2M=0.576$ msec (8 represents 8 quantities of data per phase, 24 means that each quantity is 24 bits, 3 represents a three-phase voltage, and 2M represents the current communication rate). Likewise, assuming that the state shift data includes a shift source identifier, a shift state and a shift time. When both the shift source identifier and the shift state require 1 byte, and the shift time requires 4 bytes, the communication time of the state shift data is $6*8/2M=0.024$ ms (6 indicates that the state shift data includes 6 bytes, 8 indicates that each byte includes 8 bits, and 2M indicates the current communication rate). It can be seen therefrom that a time of 7 ms is sufficient to transmit the above-mentioned metering data and state shift data. Meanwhile, for example, when transmitting the sampling data, the state shift of the low-voltage distribution switch 100 is performed, the proxy module 190 will then transmit the state shift data to the main control module 180 after a maximum delay of 3 milliseconds, which will not result in a control error of the low-voltage distribution switch 100.

In addition, in the communication mode of the embodiment of the present disclosure, the clock of the proxy module 190 is set by the main control module 160 so as to ensure the time standard of sampling data, metering data and state shift data. The specific method is as follows. A microsecond timer is started in the proxy module 190. The main control module 160 sends a clock setting frame (carrying the time T of the main control module). The proxy module 190 records the time value T1 of the microsecond timer at the moment when receiving the beginning of the frame, and records the time value T2 of the microsecond timer at the moment when receiving the end of the frame. Then the proxy module sets its own clock in the manner of $T+T2-T1$. The main control module 160 can set the clock of the proxy module once every 1 second interval, which is set at the position of 0.5 seconds per second. Thus, the clock synchronization between the main control module and the proxy module can be ensured, and the second value or the second built-in dislocation problem can be avoided when the time is carried out, thereby improving the reliability of the low-voltage distribution switch.

In some embodiments, as shown with reference to FIG. 9, the low-voltage distribution switch 100 further includes a first power supply module 1110 and a second power supply module 1120, wherein an input end of the first power supply module 1110 is connected to a plurality of input ends of the switch module 110; an output end of the first power supply module 1110 is connected to an input end of the second power supply module 1120; and an output end of the second power supply module 1120 is connected to the isolation module 1100. Here, the first power supply module 1110 is configured for converting a first power supply voltage provided by the multi-phase power supply line into a second power supply voltage. The second power supply module 1120 is configured for converting the second power supply voltage into a third power supply voltage and providing same to the isolation module 1100. The proxy module 190 and the main control module 160 are powered via the isolation module 1100.

In particular, the first power supply module 1110 may be a rectifying step-down circuit mainly for converting alternating current at the first supply voltage on the multi-phase supply line into direct current at the second supply voltage and providing the direct current to the second power supply module 1120. The second power supply module 1120 may be a step-down circuit mainly configured for stepping down the second power supply voltage to a third power supply voltage of a preset voltage value, so as to supply power to the isolation module 1100, and supplying power to the proxy module 190 and the main control module 160 via the isolation module 1100. For example, when the isolation module 1100 includes the above-mentioned NS chip, the preset voltage value is 5 v. At this time, stable 5 v DC power can be supplied to the isolation module by the first power supply module 1110 and the second power supply module 1120.

Optionally, as shown with reference to FIG. 9, the low-voltage distribution switch 100 may further include a human-machine interaction module 1130 and a communication module 1140. The human-machine interaction module 1130 can provide a human-machine interaction service for a user, so that the user can conveniently perform functions such as parameter debugging, configuration and detection on the main control module 160. The communication module 1140 can enable the main control module 160 to have a remote communication capability so as to enable a user to perform data interaction with the main control module 160 by means of remote communication. The main control module 160 can also realize an online upgrade function via the communication module 1140 so as to further optimize the low-voltage distribution switch 100.

In the above-mentioned embodiments, the main control module 160, the protection control module 170, the state acquisition module 180, the proxy module 190, the human-machine interaction module 1130 and the communication module 1140 may respectively be one or more processors, controllers or chips having a communication interface capable of realizing a communication protocol, and may further include a memory and a relevant interface, a system transmission bus, etc. if necessary. The processor, controller or chip executes program related code to realize corresponding functions. Alternatively, the main control module 160, the protection control module 170, the state acquisition module 180, the proxy module 190, the human-machine interaction module 1130, and the communication module 1140 share an integrated chip or share a processor, controller, memory, etc. The shared processor, controller or chip executes program related code to realize corresponding functions.

In summary, according to the low-voltage distribution switch of the embodiment of the present disclosure, by providing a plurality of current detection modules and a metering module, and each current detection module including a plurality of current detection units and a plurality of current branches connected in parallel, when the low-voltage distribution switch is working normally, the plurality of current branches of each current detection module can achieve the effect of shunting, so that the accuracy and linearity of the plurality of branch current detection signals obtained by the current detection units can be improved, thereby improving the linearity and accuracy of the power metering function. Meanwhile, a voltage sampling module, an ADC sampling module and a main control module are provided in the low-voltage distribution switch, and the main control module can acquire that the ADC sampling module and the measurement module sample perform corresponding analysis on the voltage and current of the power supply line via the current detection module and the voltage detection module, so as to realize the functions of mutual backup and mutual correction of the power supply protection and electric energy measurement functions, and improve the accuracy and reliability of the power supply protection and electric energy measurement functions. In addition, by setting a proxy module and an isolation module in the low-voltage distribution switch and reasonably dividing the functional modules, the electrical isolation and data exchange between the primary portion and the secondary portion are realized with a simple isolation structure, so that the cost of the low-voltage power supply switch can be saved, the safety of personnel operation is ensured, and the comprehensive optimization of the low-voltage distribution switch is realized.

Figure 12:
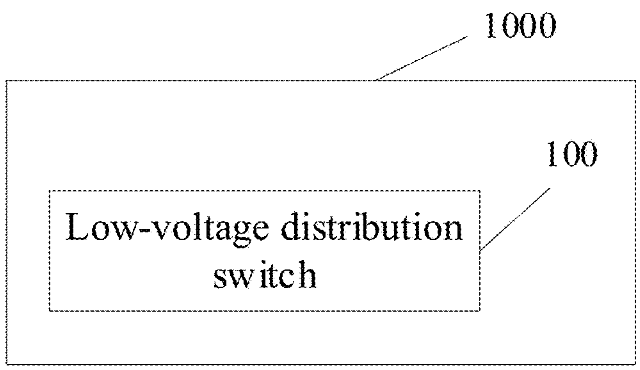
FIG. 12 is a schematic structural diagram of a power supply device according to an embodiment of the present disclosure.

Corresponding to the above-described embodiment, the embodiment of the present disclosure also provides a power supply device, which, as shown with reference to FIG. 12, includes the aforementioned low-voltage distribution switch 100.

According to the power supply device of the embodiment of the present disclosure, by means of the aforementioned low-voltage distribution switch, it is possible to realize the power metering function with high linearity and accuracy. Meanwhile, it is also possible to realize the mutual backup and mutual correction functions of the power supply protection and the power metering function. Also, it is possible to realize the isolated communication function of the low-voltage part and the high-voltage part, thereby enabling the optimization of the power supply device.

It should be noted that the logic and/or steps represented in the flowcharts or otherwise described herein, e.g., an ordered listing of executable instructions that can be thought of as implementing logical functions, can be embodied in any computer-readable medium for use by or in connection with an instruction execution system, apparatus, or device, such as a computer-based system, a processor-containing system, or other system that can fetch the instructions from the instruction execution system, apparatus, or device and execute the instructions. In the context of this specification, a “computer-readable medium” can be any means that can contain, store, communicate, propagate, or transmit the program for use by or in connection with the instruction execution system, apparatus, or device. More specific examples (a non-exhaustive list) of computer-readable media include the followings: an electrical connection (electronic device) having one or more wirings, a portable computer disc cartridge (magnetic device), a random access memory (RAM), a read-only memory (ROM), an erasable programmable read-only memory (EPROM or flash memory), an optical fiber device, and a portable optical disc read-only memory (CDROM). In addition, the computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

It should be understood that portions of the present disclosure may be implemented in hardware, software, firmware, or a combination thereof. In the embodiments described above, the steps or methods may be implemented in software or firmware stored in the memory and executed by a suitable instruction execution system. For example, if implemented in hardware, as in another embodiment, it may be implemented using any one or combination of the following techniques known in the art: discrete logic circuits having logic gates for implementing logic functions on data signals, application specific integrated circuits having appropriate combinational logic gates, programmable gate arrays (PGA), field programmable gate arrays (FPGA), and the like.

In the description of this description, reference to the terms "an embodiment", "some embodiments", "example", "a specific example" and "some examples", etc., means that specific features, structures, materials, or characteristics described in connection with the embodiment or example is included in at least an embodiment or example of the present disclosure. In the present specification, schematic statement of the above terms do not necessarily refer to the same embodiment or example. Furthermore, the particular features, structures, materials, or characteristics described may be combined in any suitable manner in any one or more embodiments or examples.

Furthermore, the terms "first" and "second" are used for descriptive purposes only and are not to be construed as indicating or implying relative importance or implicitly indicating the number of technical features indicated. Thus, a feature defined by "first" or "second" may explicitly or implicitly include at least one such feature. In the description of the present disclosure, "a plurality of" means at least two, e.g., two, three, etc. unless specifically and specifically limited otherwise.

In the present disclosure, unless expressly stated or limited otherwise, the terms "mounted", "connected", "connecting", "fixed", and the like are to be interpreted broadly, e.g., either fixedly or detachably, or integrally modularization. It may be a mechanical connection or an electrical connection. It may be a direct connection or indirect connection by an intermediary. It may be a communication between two elements, or may be in an interactive relationship between two elements, unless explicitly defined otherwise. The specific meaning of the above terms in this present disclosure will be understood in specific circumstances by those of ordinary skill in the art.

While embodiments of the present disclosure have been shown and described, it will be understood that the above-described embodiments are illustrative and are not to be construed as limiting the present disclosure, and that variations, modifications, substitutions, and alterations in the above-described embodiments may be effected by one of ordinary skill in the art without departing from the scope of the present disclosure.

The invention claimed is:

1. A low-voltage distribution switch, comprising:

a switch module, wherein a plurality of input ends of the switch module serve as voltage inlet wire ends of the low-voltage distribution switch and are configured to correspondingly connect to a multi-phase power supply line; the switch module is configured to connect or disconnect the multi-phase power supply line;

a plurality of current detection modules, wherein input ends of the plurality of current detection modules are correspondingly connected to a plurality of output ends of the switch module; output ends of the plurality of current detection modules serve as voltage outlet wire ends of the low-voltage distribution switch and are configured to correspondingly connect to the multi-phase power supply line; each of the current detection modules comprises a plurality of current branches and a current detection unit, wherein the plurality of current branches are connected in parallel between the input end and the output end of the corresponding current detection module; the current detection unit is configured to detect the current of each current branch to obtain a plurality of branch current detection signals, and obtain a current detection signal of a corresponding phase power supply line on the basis of a plurality of branch current detection signals;

a voltage detection module, wherein a plurality of input ends of the voltage detection module are connected to a plurality of output ends of the switch module and a neutral line inlet end of the low-voltage distribution switch; the neutral line inlet end is configured to connect to a neutral line of the power supply line; the voltage detection module is configured to detect a voltage of each phase power supply line of a multi-phase power supply line to obtain a plurality of voltage detection signals; and a metering module, wherein the metering module is respectively connected to the voltage detection module and a plurality of the current detection units; the metering module is configured to sample the plurality of voltage detection signals and the plurality of current detection signals, obtain a plurality of first voltages according to the plurality of voltage detection signals, calculate a plurality of first currents according to the plurality of the current detection signals, and determine first electric energy metering data of the multi-phase power supply line based on the plurality of first voltages and the plurality of first currents.

2. The low-voltage distribution switch according to claim 1, wherein the current detection unit comprises:

a plurality of current transformers, wherein input ends of the plurality of current transformers are correspondingly coupled and connected to the plurality of current branches; each of the current transformers is configured to detect the current of a corresponding current branch to obtain the branch current detection signal; and an adder module, wherein an input end of the adder module is connected to output ends of the plurality of current transformers; an output end of the adder module is connected to the metering module; and the adder module is configured to sum up the plurality of branch current detection signals to obtain a current detection signal of a corresponding phase power supply line.

3. The low-voltage distribution switch according to claim 2, wherein the adder module comprises:

a plurality of signal buffers, wherein input ends of the plurality of signal buffers are correspondingly connected to output ends of the plurality of current transformers; each of the signal buffers is configured to buffer a corresponding branch current detection signal; and an adder, wherein a plurality of input ends of the adder are correspondingly connected to output ends of the plurality of signal buffers; an output end of the adder is connected to the metering module; and the adder is configured to sum up the buffered plurality of branch current detection signals to obtain a current detection signal of a corresponding phase power supply line.

4. The low-voltage distribution switch according to claim 3, wherein the signal buffer comprises:

a first resistor, wherein one end of the first resistor is connected to a first output end of a corresponding current transformer;

a second resistor, wherein one end of the second resistor is connected to a second output end of the corresponding current transformer;

a first operational amplifier, wherein a first input end of the first operational amplifier is connected to the other end of the first resistor; a second input end of the first operational amplifier is connected to the other end of the second resistor; an output end of the first operational amplifier is connected to a corresponding input end of the adder;

a third resistor connected in series between the second input end of the first operational amplifier and ground; and a fourth resistor connected in series between the first input end and the output end of the first operational amplifier.

5. The low-voltage distribution switch according to claim 4, wherein the first resistor, the second resistor, the third resistor and the fourth resistor have a same resistance value.

6. The low-voltage distribution switch according to claims 5, wherein the adder comprises:

a plurality of fifth resistors, wherein one end of the plurality of fifth resistors is correspondingly connected to the output ends of the plurality of signal buffers;

a second operational amplifier, wherein a first input end of the second operational amplifier is connected to the other ends of the plurality of fifth resistors; a second input end of the second operational amplifier is grounded; an output end of the second operational amplifier is connected to the metering module; and a sixth resistor, wherein the sixth resistor is connected in series between the first input end and the output end of the second operational amplifier.

7. The low-voltage distribution switch according to claim 6, wherein the fifth resistance and the sixth resistance have a same resistance value.

8. The low-voltage distribution switch according to claim 1, wherein the current detection module further comprises:

a shunt, wherein an input end of the shunt serves as an input end of the current detection module; and a current combiner, wherein a plurality of input ends of the current combiner are correspondingly connected to a plurality of output ends of the shunt via a plurality of voltage connection lines; and an output end of the current combiner serves as an output end of the current detection module;

wherein the plurality of current branches are formed by the shunt, the current combiner and the plurality of voltage connection lines, and are connected in parallel between the input end and the output end of the corresponding current detection module.

9. The low-voltage distribution switch according to claim 8, wherein the shunt comprises a first conductive member, a voltage inlet wire and a plurality of first voltage branch lines, wherein one end of the voltage inlet wire serves as an input end of the shunt, and the other end of the voltage inlet wire is connected to an input end of the first conductive member; one ends of the plurality of first voltage branch lines are connected to a plurality of output ends of the first conductive member, and the other ends of the plurality of first voltage branch lines serve as a plurality of output ends of the shunt, wherein the plurality of output ends of the first conductive member are located on the same side of the first conductive member, and the plurality of output ends of the first conductive member and the input ends of the first conductive member are located on different sides of the first conductive member.

10. The low-voltage distribution switch according to claim 9, wherein the current combiner comprises a second conductive member, a plurality of second voltage branch lines and a voltage outlet wire, wherein one ends of the plurality of second voltage branch lines serve as a plurality of input ends of the current combiner, the other ends of the plurality of second voltage branch lines are connected to the plurality of input ends of the second conductive member; one end of the voltage outlet wire is connected to an output end of the second conductive member, and the other end of the voltage outlet wire serves as an output end of the current combiner, wherein the plurality of input ends of the second conductive member are located on a same side of the second conductive member; and the plurality of input ends of the second conductive member and the output end of the second conductive member are located on different sides of the second conductive member.

11. The low-voltage distribution switch according to claim 2, wherein the plurality of current transformers are divided into at least one transformer group, wherein the transformer group comprises two current transformers symmetrically arranged on both sides of the support plate and having opposite winding directions; and two adjacent current transformers located on a same side of the support plate have opposite winding directions.

12. The low-voltage distribution switch according to claim 1, wherein the low-voltage distribution switch further comprises a Analog-to-Digital Converter (ADC) sampling module, wherein the ADC sampling module is connected to a plurality of current detection units; and the ADC sampling module is configured to sample a plurality of current detection signals to obtain a plurality of current sampling signals for performing power supply protection based on the plurality of current sampling signals.

13. The low-voltage distribution switch according to claim 12, wherein the ADC sampling module is further connected to the voltage detection module; and the ADC sampling module is further configured to sample a plurality of the voltage detection signals to obtain a plurality of voltage sampling signals for performing power supply protection based on the plurality of current sampling signals and the plurality of voltage sampling signals.

14. The low-voltage distribution switch according to claim 13, wherein the low-voltage distribution switch further comprises a main control module connected to the metering module and the ADC sampling module, wherein the main control module is configured to acquire the first electric energy metering data from the metering module when the metering module has not failed, acquire the plurality of current sampling signals and the plurality of voltage sampling signals from the ADC sampling module when the metering module fails, and determine the first electrical energy metering data based on the plurality of current sampling signals and the plurality of voltage sampling signals;

the main control module is further configured to acquire the plurality of current sampling signals and the plurality of voltage sampling signals from the ADC sampling module when the ADC sampling module has not failed, to perform power supply protection based on the plurality of current sampling signals and the plurality of voltage sampling signals; when the ADC sampling module fails, acquire the plurality of first currents and the plurality of first voltages from the metering module to perform power supply protection based on the plurality of first currents and the plurality of first voltages.

15. The low-voltage distribution switch according to claim 14, wherein the main control module is further configured to acquire the plurality of voltage sampling signals from the ADC sampling module, acquire the plurality of first voltages from the metering module, and determine whether the metering module and the ADC sampling module fail based on the plurality of voltage sampling signals and the plurality of first voltages.

16. The low-voltage distribution switch according to claim 15, wherein the main control module is configured to calculate a plurality of second voltages according to the plurality of voltage sampling signals, acquire a voltage difference value between each of the first voltages and the corresponding second voltage to obtain a plurality of voltage difference values, and determine whether the metering module and the ADC sampling module fail based on the plurality of first voltages and the plurality of second voltages when any voltage difference value in the plurality of voltage difference values is greater than or equal to a first preset voltage difference value threshold.

17. The low-voltage distribution switch according to claim 16, wherein the main control module is configured to determine whether the metering module and the ADC sampling module fail based on at least one of a DC component, a magnitude, a waveform distortion, a power, a power factor, a frequency, and a phase sequence corresponding to the plurality of first voltages and the plurality of second voltages.

18. The low-voltage distribution switch according to claim 17, wherein the main control module is configured to determine that the metering module fails when the direct current component of the first voltage is greater than a preset direct current component, and determine that the ADC sampling module fails when the DC component of the second voltage is greater than the preset DC component.

19. The low-voltage distribution switch according to claim 17, wherein the main control module is configured to determine that the metering module fails when the amplitude of the first voltage is not within a preset amplitude range, and determine that the ADC sampling module fails when the amplitude of the second voltage is not within the preset amplitude range.

20. The low-voltage distribution switch according to claim 17, wherein the main control module is configured to determine that the metering module fails when the waveform distortion of the first voltage is greater than a first preset distortion, or the waveform distortion of the first voltage is greater than the waveform distortion of the second voltage, and a difference value between the waveform distortion of the first voltage and the waveform distortion of the second voltage is greater than a second preset distortion; determine that the ADC sampling module fails when the waveform distortion of the second voltage is greater than the first preset distortion, or the waveform distortion of the second voltage is greater than the waveform distortion of the first voltage, and the difference value between the waveform distortion of the second voltage and the waveform distortion of the first voltage is greater than the second preset distortion.

21. The low-voltage distribution switch according to claim 17, wherein the main control module is configured to determine that the metering module fails when the first power corresponding to the first voltage is negative, and determine that the ADC sampling module fails when the second power corresponding to the second voltage is negative.

22. The low-voltage distribution switch according to claim 17, wherein the main control module is configured to determine that the metering module fails when a first power factor corresponding to the first voltage is less than a preset power factor, and determine that the ADC sampling module fails when a second power factor corresponding to the second voltage is less than the preset power factor.

23. The low-voltage distribution switch according to claim 17, wherein the main control module is configured to determine that the ADC sampling module fails when a frequency difference value between the frequency of the first voltage and a preset frequency is less than a frequency difference value between the frequency of the second voltage and the preset frequency, and a frequency difference between the frequency of the second voltage and the frequency of the first voltage is greater than a preset frequency difference; determine that the metering module fails when the frequency difference value between the frequency of the second voltage and the preset frequency is less than the frequency difference value between the frequency of the first voltage and the preset frequency, and the frequency difference value between the frequency of the first voltage and the frequency of the second voltage is greater than the preset frequency difference.

24. The low-voltage distribution switch according to claim 17, wherein the main control module is configured to determine that the metering module fails when the phase sequence of the plurality of first voltages are different from a preset phase sequence;

and determine that the ADC sampling module fails when the phase sequence of the plurality of second voltages are different from the preset phase sequence.

25. The low-voltage distribution switch according to claim 14, wherein a first frequency at which the main control module acquires the plurality of first currents and the plurality of first voltages from the metering module is less than a second frequency at which the plurality of current sampling signals and the plurality of voltage sampling signals are acquired from the ADC sampling module, wherein the main control module is further configured to perform power supply protection based on the plurality of first currents, the plurality of first voltages and the first frequency when the ADC sampling module fails.

26. The low-voltage distribution switch according to claim 16, wherein the main control module is further configured to modify the plurality of first voltages and the plurality of first currents based on a ratio of the second voltage to the first voltage when each of the plurality of voltage difference values is less than the first preset voltage difference value threshold and greater than a second preset voltage difference value threshold, wherein the second preset voltage difference value threshold is less than the first preset voltage difference value threshold.

27. The low-voltage distribution switch according to claim 14, wherein the main control module is further configured to analyze the first electrical energy metering data to obtain second electrical energy metering data.

28. The low-voltage distribution switch according to claim 14, wherein the low-voltage distribution switch further comprises:

a protection control module, wherein the protection control module is connected to the switch module for controlling the switch module;

wherein the main control module is further connected to the protection control module;

the main control module is further configured to generate a protection signal and send same to the protection control module according to the plurality of current sampling signals and the plurality of voltage sampling signals, or according to the plurality of first currents and the plurality of first voltages, whereby the protection control module controls the switch module for disconnection to provide power supply protection based on the protection signal.

29. The low-voltage distribution switch according to claim 28, wherein the low-voltage distribution switch further comprises a state acquisition module, wherein the state acquisition module is connected to the switch module and the main control module; and the state acquisition module is configured to acquire a switch state and/or a power supply protection mode of the switch module and send same to the main control module.

30. The low-voltage distribution switch according to claim 29, wherein the low-voltage distribution switch further comprises a proxy module and an isolation module, wherein the proxy module is connected to the metering module, the ADC sampling module, the protection control module, the state acquisition module and the isolation module; the isolation module is connected to the main control module, wherein the proxy module is configured to acquire the first electric energy metering data, the plurality of first voltages, the plurality of first currents, the plurality of voltage sampling signals, the plurality of current sampling signals and the switch state and/or the power supply protection mode, send same to the main control module via the isolation module, and receive the protection signal by the isolation module and send same to the protection control module.

31. The low-voltage distribution switch according to claim 30, wherein the proxy module sends data of the metering module with a lower priority than that of data of the ADC sampling module and with a higher priority than that of data of the state acquisition module.

32. The low-voltage distribution switch according to claim 30, wherein the low-voltage distribution switch further comprises a first power supply module and a second power supply module, wherein an input end of the first power supply module is connected to the plurality of input ends of the switch module; an output end of the first power supply module is connected to an input end of the second power supply module; and an output end of the second power supply module is connected to the isolation module, wherein the first power supply module is configured to convert a first power supply voltage provided by the multiphase power supply line into a second power supply voltage; the second power supply module is configured to convert the second power supply voltage into a third power supply voltage and provide same to the isolation module; and the proxy module and the main control module are powered by the isolation module.

33. A power supply device, comprising the low-voltage distribution switch according to claims 1.

* * * * *